United States Patent [19]
Ema et al.

[11] Patent Number: 5,780,907
[45] Date of Patent: Jul. 14, 1998

[54] SEMICONDUCTOR DEVICE HAVING TRIPLE WELLS

[75] Inventors: Taiji Ema; Kazuo Itabashi; Shinichiroh Ikemasu; Junichi Mitani; Itsuo Yanagita; Seiichi Suzuki, all of Kawasaki, Japan

[73] Assignee: Fujitsu Limited, Kawasaki, Japan

[21] Appl. No.: 819,488

[22] Filed: Mar. 17, 1997

Related U.S. Application Data

[63] Continuation of Ser. No. 507,978, Jul. 27, 1995, abandoned.

[30] Foreign Application Priority Data

Sep. 22, 1994 [JP] Japan ................................. 6-228403

[51] Int. Cl.$^6$ ........................... H01L 29/76; H01L 29/94
[52] U.S. Cl. ................................... 257/371; 257/345
[58] Field of Search .......................... 257/345; 365/371, 365/226

[56] References Cited

U.S. PATENT DOCUMENTS

| | | | |
|---|---|---|---|
| 5,373,476 | 12/1994 | Jeon | 365/226 |
| 5,514,889 | 5/1996 | Cho et al. | 257/371 |

FOREIGN PATENT DOCUMENTS

| | | |
|---|---|---|
| 64-15965 | 1/1989 | Japan . |
| 2-77153 | 3/1990 | Japan . |
| 7-142605 | 6/1995 | Japan . |

OTHER PUBLICATIONS

Genus, Inc. Presents: "The 1990's Smart and Economic Device and Process Desings for ULSI Technology", Parc Fifty-Five Hotel, San Francisco, CA, Jul. 21, 1993.

H. Mikoshiba, "A novel CMOS Process Utilizing After-Gate-Implantation Process", 1986 Symposium on VLSI technology.

John Ogawa et al., "MeV implantation technology: Next generation manufacturing with current-generation equipment", Solid State Technology, pp. 28-35.

*Primary Examiner*—Steven H. Loke
*Attorney, Agent, or Firm*—Nikaido, Marmelstein, Murray & Oram LLP

[57] ABSTRACT

A semiconductor device including a semiconductor substrate 10 of a first conduction-type, first wells 20a, 20b of a second conduction-type formed in a first region on the primary surface of the semiconductor substrate 10, a second well 22a formed in a second region on the primary surface of the semiconductor substrate 10 other than the first region, a third well 22b of the first conduction-type formed in the first well, and high-concentration impurity-doped layers 26 of the first conduction-type formed in deep portions of the semiconductor substrate spaced from the primary surface of the semiconductor device in device regions. In a semiconductor device having triple wells, the high-concentration impurity-doped layers are formed in deep portions inside of the device regions. Accordingly, in the case where the wells have a low concentration so that the transistors have a low threshold voltage, the deep portions of the wells can independently have a high concentration. As a result, punch-through between the source/drain diffused layer of the transistor formed in an inner well of a double well, and the well outside of the double well can be prevented. This structure is also effective to prevent latch-up.

6 Claims, 21 Drawing Sheets

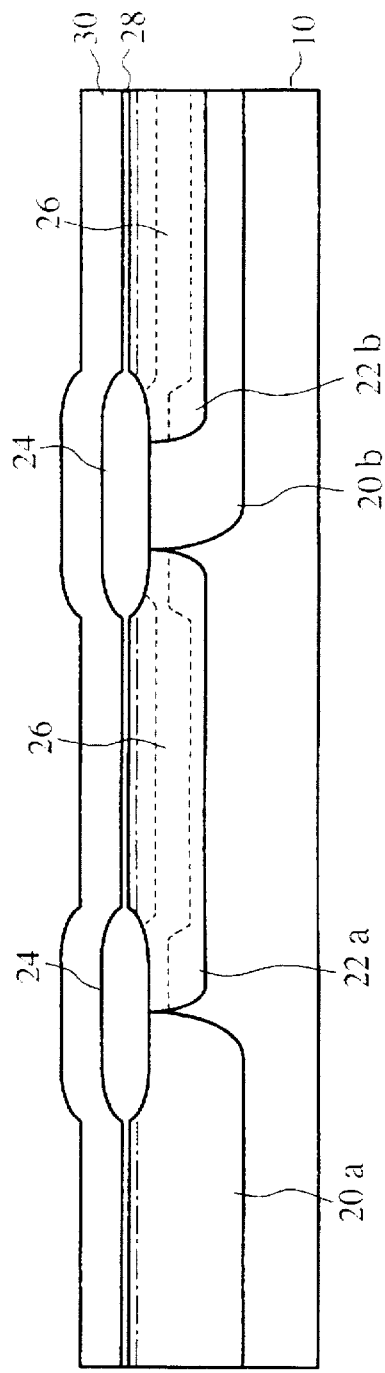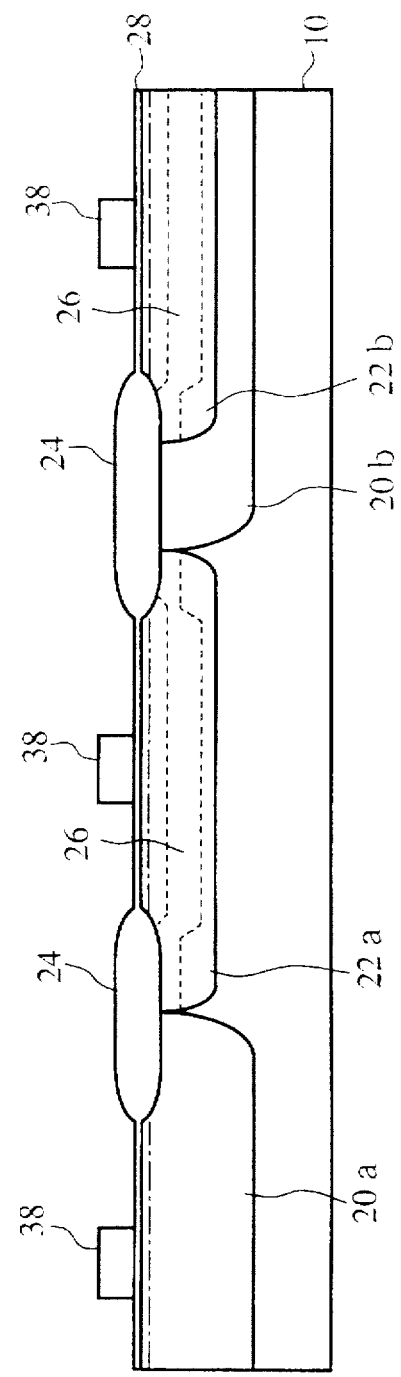

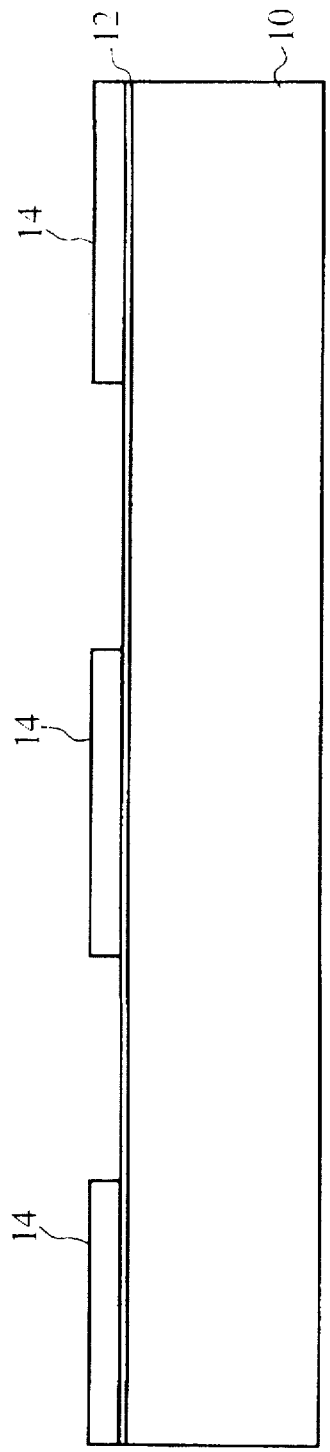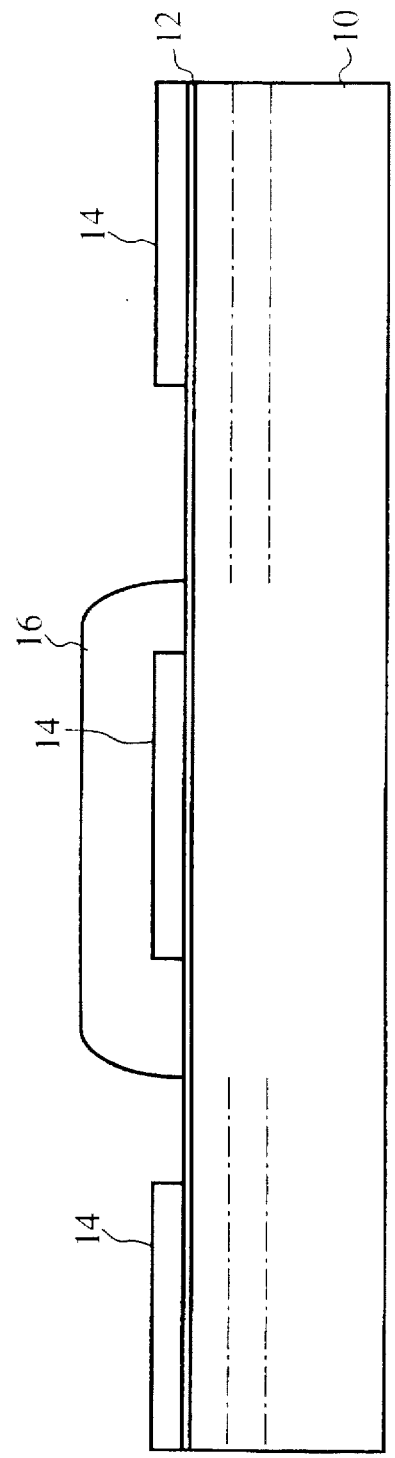

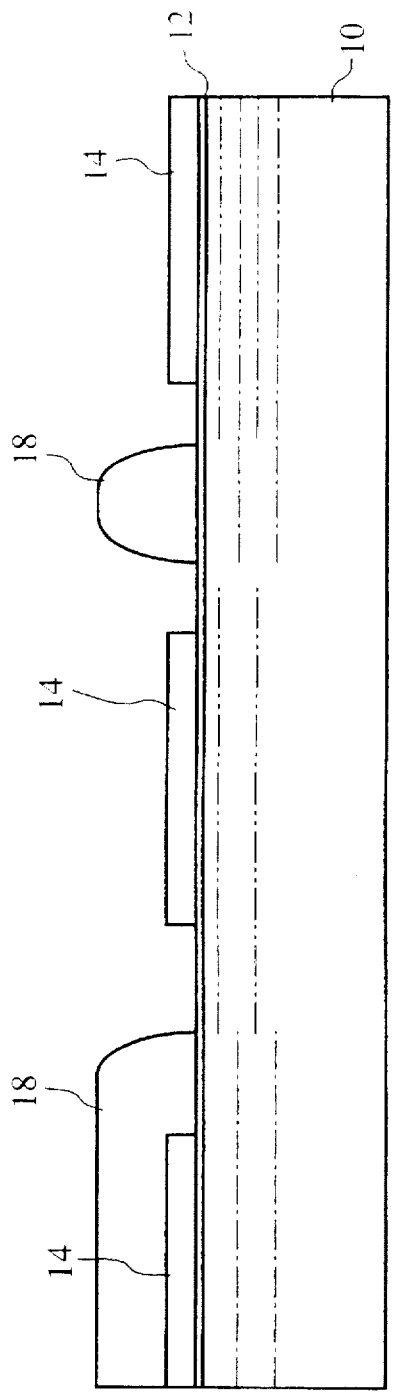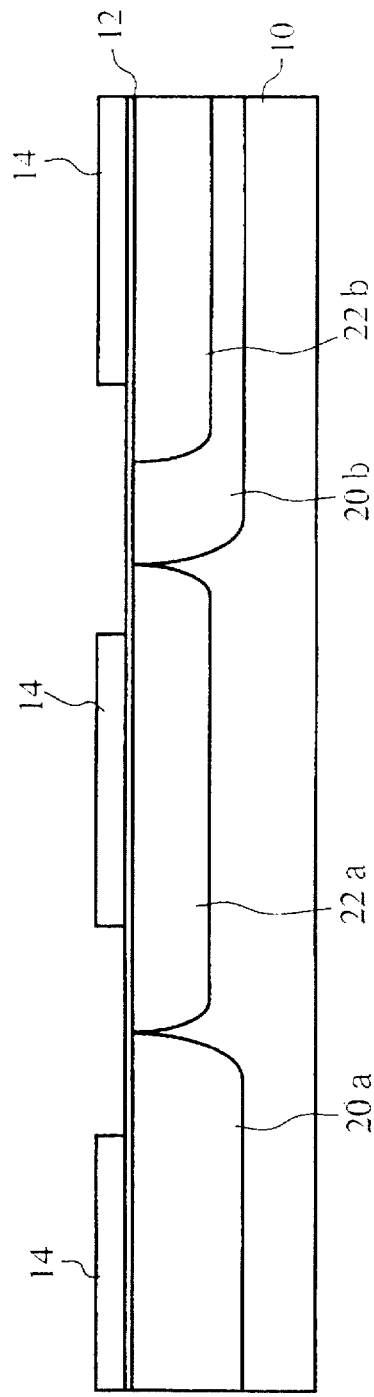

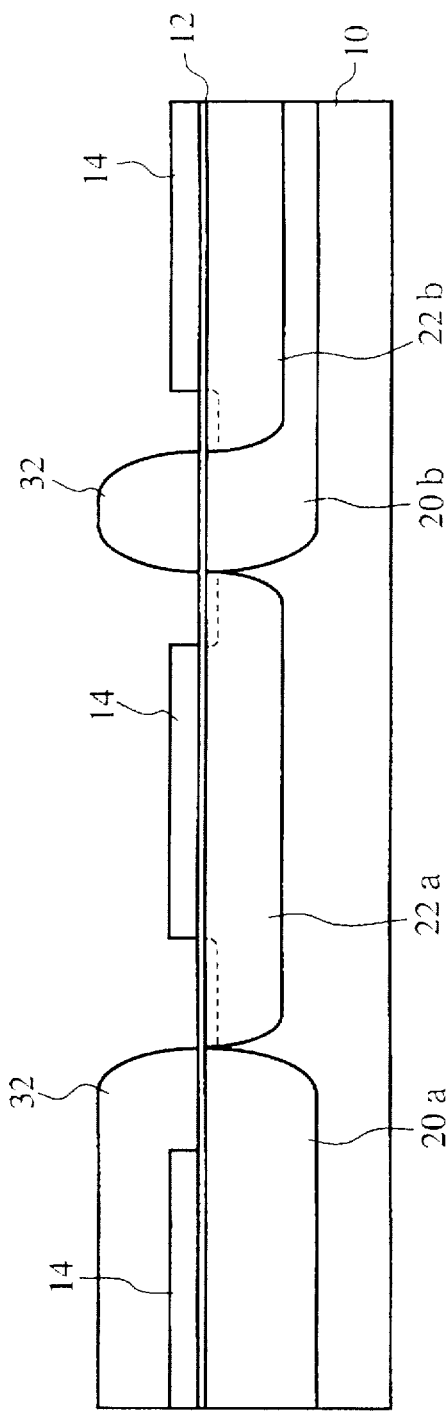
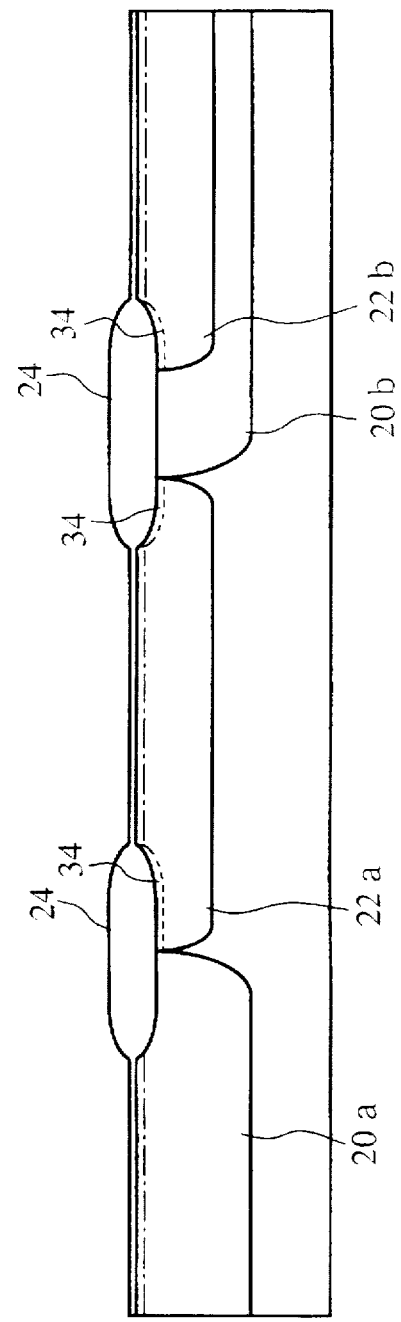

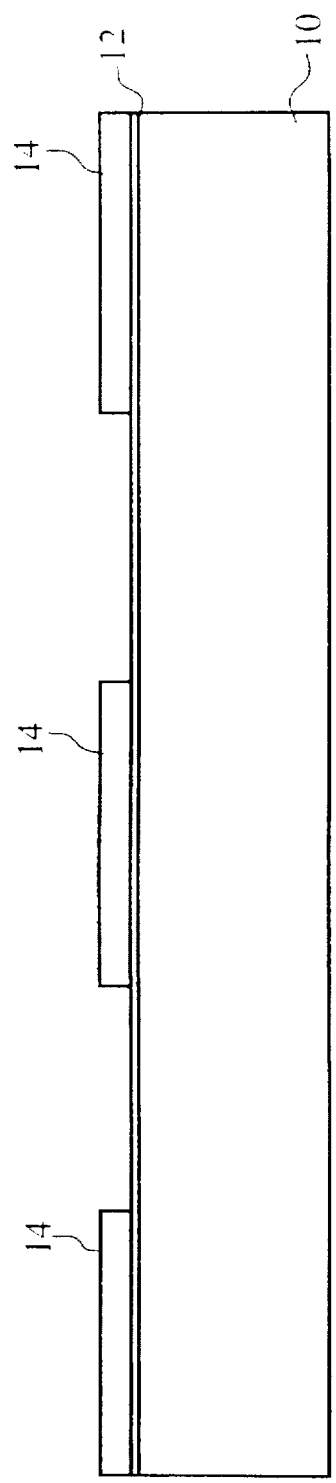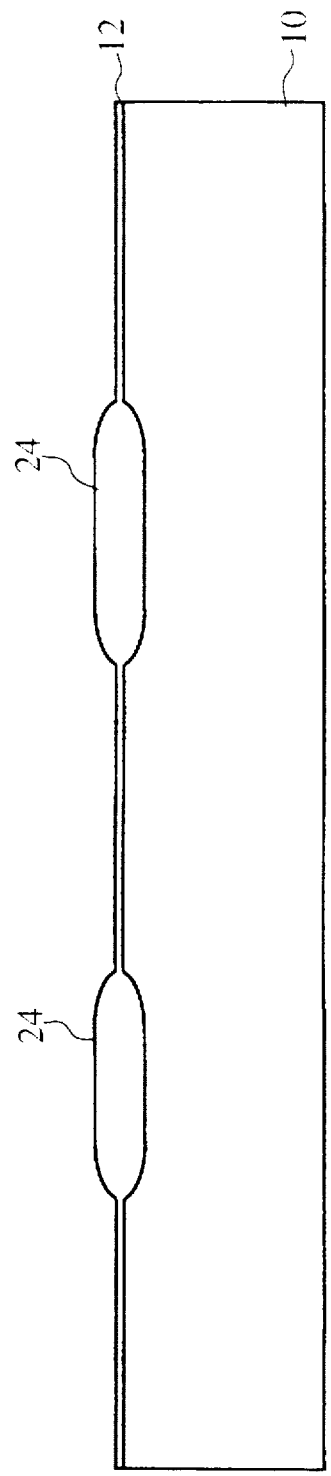

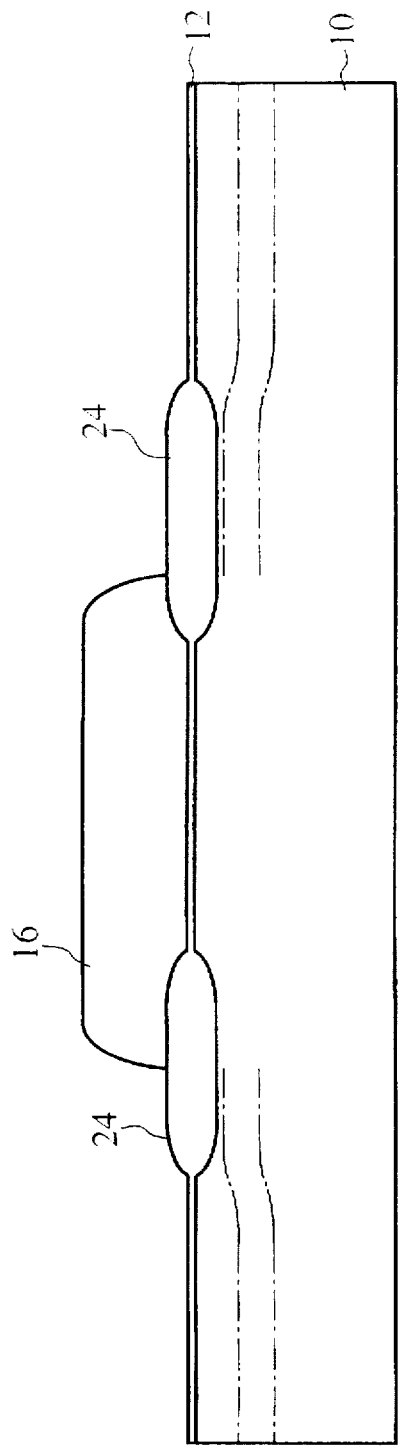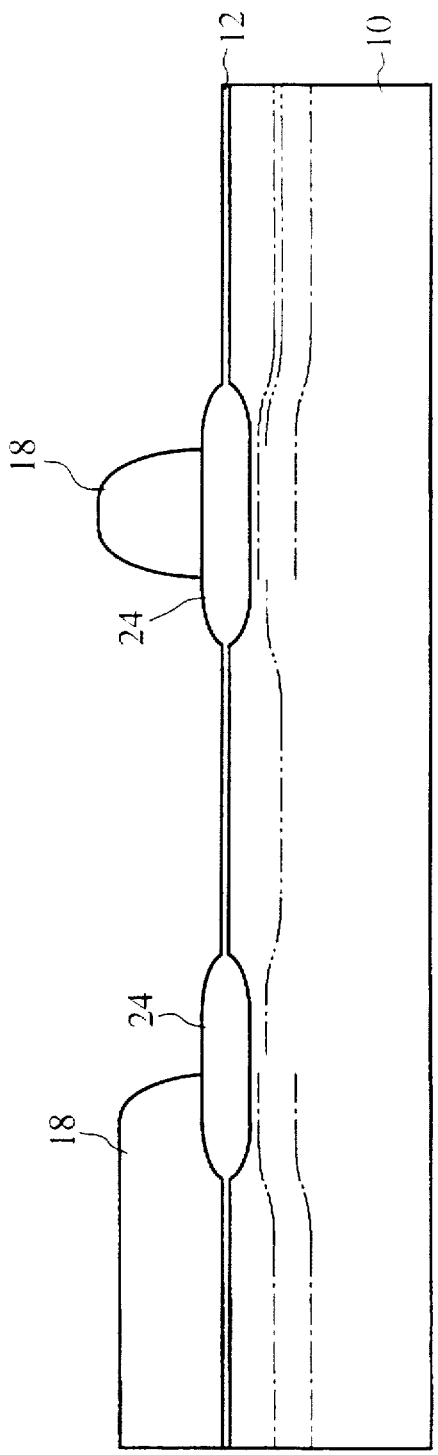

SEMICONDUCTOR DEVICE HAVING TRIPLE WELLS

This application is a continuation of application Ser. No. 08/507,978 filed Jul. 27, 1995, now abandoned.

BACKGROUND OF THE INVENTION

The present invention relates to a semiconductor device with triple wells, and a method for fabricating the same.

The so-called triple well technique, by which, for formation of a plurality of wells of different potentials, an n-well and a p-well constituting a CMOS are formed, and additionally a well of a different conduction type is formed in either of the n-well and the p-well, is partially used in fabrication of recent semiconductor devices.

For example, in conventional DRAMs, because a voltage $V_{BB}$ applied to a memory cell is applied as it is also to the input circuit, when an undershoot waveform input is applied, a current flows through the wells to adversely vary a potential of the voltage $V_{BB}$, and it becomes difficult for the memory cell to maintain the electric charge. Accordingly, it is necessary that the voltage $V_{BB}$ has a potential sufficient not to vary due to an undershoot waveform input.

But to operate the DRAMs at low voltages, it is preferable that the threshold voltages of the n-type transistors of peripheral circuits are as low as possible, and no voltage $V_{BB}$ is applied to the n-type transistors in operation. It is also necessary to set the well potentials of the sense amplifier region and the memory cell region to be different from each other.

To this end, the structure of a well inside a well is formed, whereby a potential of the inner well is independently changed.

As a conventional triple well forming method, a method for fabricating a semiconductor device is proposed in, e.g., Japanese Patent Application No. 05-292179/1993.

According to the method for fabricating a semiconductor device described in Japanese Patent Application No. 05-292179/1993, first a silicon substrate 10 is oxidized to form a silicon oxide film 12, then a silicon nitride film 14 is deposited, and next the silicon nitride film 14 is patterned for device isolation (FIG. 20A).

Subsequently a photo resist patterning is conducted by lithography, and n-type impurity ions are implanted selectively in regions for n-wells to be formed in. Following removal of the resist, a high-temperature heat treatment is conducted to drive in the n-type impurity (FIG. 20B).

Next, a photo resist patterning is conducted by lithography to implant p-type impurity ions selectively in a region inside the n-wells for p-wells to be formed in, and in regions of a p-type substrate where the n-wells are not formed and p-wells are to be formed. Following removal of the resist, a high-temperature heat treatment is conducted to drive in the p-type impurity, and the n-wells 20a, the p-wells 22a, and the p-wells 22b in the n-wells 20b are formed (FIG. 20C).

Then oxidation is conducted with the silicon nitride film 14 as a mask to form device isolation films 24 (FIG. 20D).

Impurity concentrations of the wells were determined as follows. First, the dose of the n-type impurity ions for the formation of the n-wells 20a is so set that the field threshold voltage of p-type parasitic transistors to be formed in the n-wells 20a can be sufficiently lower than the operating voltages. Then the dose of the p-type impurity ions for control of the threshold voltage is so determined that the threshold voltage of the p-type transistors formed in the n-wells 20a has the required value. Next, the dose of the p-type impurity ions for the formation of the p-wells 22a is so determined that the threshold voltages of all transistors can be simultaneously adjusted at the implantation step. That is, the dose for the formation of the p-wells 22a is so determined that the dose achieves the required threshold voltage of the p-type transistors in the n-wells 20a and achieves the threshold voltage of the n-type transistors in the p-wells 22a. Then, the gate length and the substrate bias are so optimized that the n-type transistors formed in the p-wells 22b in the n-wells 20b has required characteristics.

Thus, not only can two lithography steps form three kinds of wells, but can also set threshold voltages of the transistors formed in the respective wells at the required values, and furthermore can form channel stoppers of the p-type parasitic transistors.

As another method for forming triple wells, a method for fabricating a semiconductor device using high-energy ion implantation which does not require high-temperature long-time well diffusion has been proposed.

In this method, first of all, device isolation films 24 are formed on a silicon substrate 10 (FIG. 21A). Next, with selectively formed resists 60 as a mask, buried n-type layers 62 are formed in the substrate by high-energy ion implantation (FIG. 21B).

Subsequently, patterning is conducted by lithography so as to cover regions for p-wells to be formed in with resists 64, and with selectively formed resists 64 as a mask, ions are implanted to form n-wells 66 and to control the threshold voltage of p-type transistors formed in the n-wells. In this step, island-shaped p-type regions 68 which are surrounded by the buried n-type layers 62 and the n-wells 66, are formed (FIG. 21C).

Next, resist patterning is conducted by lithography, and with selectively formed resists 70 as a mask, ions are implanted to form p-wells 72 and to control a threshold voltage of n-type transistors formed in the p-wells 72 (FIG. 21D).

Thus, this method for forming triple wells by high-energy ion implantation can omit two well diffusion steps. Resultantly, the process can be simple and has lower costs. In addition, the buried n-wells are reverse-biased to collect electrons generated by incidence of α-particles, so that soft error rates can be drastically improved.

But the method for fabricating a semiconductor device described in the above-described Japanese Patent Application No. 05-292179/1993 has the problem that because of two well diffusion steps, impurities implanted for formation of the wells are largely laterally diffused. This is very disadvantageous to miniaturization of devices.

To realize high-speed operation and suppress generation of hot carriers, it is important that the device has a low operational voltage, and the transistors have low threshold voltages. Accordingly, in order for the p-type transistors have a low threshold voltage, a large dose of impurities is necessary for control of the threshold voltage, whereby the n-type transistors have a high threshold voltage. Thus it is necessary that the p-wells have a low impurity concentration. However, when the impurity concentration of the p-well is decreased, the punch-through voltage between the source/drain diffused layers of the n-type transistors formed in the p-wells in the n-wells, and the n-wells immediately below the p-wells, is lowered. As a result, the required low threshold voltage transistors cannot be formed. This is a problem the inventors newly found.

The above-described method for fabricating a semiconductor device by high-energy ion implantation can omit the two well diffusion steps, but needs three lithography steps for forming the wells. As a result, more lithography steps are needed. Another problems of high energy process are: 1. high-energy equipments are very expensive so that the fabrication cost increases; 2. high energy implantation causes some damage in Si substrate so that the leakage in memory cells increases. This is a problem.

SUMMARY OF THE INVENTION

An object of the present invention is to provide a semiconductor device with triple wells and a method for fabricating the same, in which the lateral diffusion of the wells can be lowered, punch-through between the source/drain diffusion layers of the transistors formed in wells inside wells, and the outside wells can be prevented, and, which can be fabricated without adding fabrication steps.

The above-described object is achieved by a semiconductor device comprising: a first conduction-type semiconductor substrate; a first well of a second conduction-type formed in a first region in a primary surface of the semiconductor substrate; a second well of the first conduction-type formed in a second region in the primary surface of the semiconductor substrate, the second region being other than the first region; a third well of the first conduction-type formed in the first well; and a high-concentration impurity-doped layer of the first conduction-type formed in a region of the third well deep in the semiconductor substrate spaced from the primary surface of the semiconductor substrate in a device region, an impurity concentration of the high-concentration impurity-doped layer being higher than that of the third well.

In the above-described semiconductor device, it is preferable that the high-concentration impurity-doped layer is formed immediately below a device isolation film defining the device region.

The above-described object is also achieved by a semiconductor device comprising: a first conduction-type semiconductor substrate; a first well of a second conduction-type formed in a first region in a primary surface of the semiconductor substrate; a second well of the first conduction-type formed in a second region in the primary surface of the semiconductor substrate, which is other than the first region; and a third well of the first conduction-type formed in the first well, an impurity concentration of the third well deep in the semiconductor substrate spaced from the primary surface of the semiconductor substrate being higher than that at the primary surface thereof.

In the above-described semiconductor device, it is preferable that an impurity concentration of the first well deep in the semiconductor substrate spaced from the primary surface of the semiconductor substrate is higher than that at the primary surface thereof.

The above-described object is also achieved by a method for fabricating a semiconductor device comprising: a first resist pattern forming step of forming a first resist pattern with a first opening on a semiconductor substrate of a first conduction-type; a first impurity doping step of doping a first impurity in the semiconductor substrate with the first resist pattern as a mask; a second resist pattern forming step of forming a second resist pattern with a second opening formed in a region other than a region of the first opening and with a third opening formed in a region within the first opening; a second impurity doping step of doping a second impurity with the second resist pattern as a mask; a well forming step of activating the implanted first and second impurities to form a first well of the second conduction-type in the first opening, a second well of a first conduction-type in the second opening, and a third well of the first conduction-type in the first well in the third opening; a third resist forming step of forming a third resist with a fourth opening formed in the same region as the third opening; and a high-concentration impurity-doped layer forming step of doping a third impurity in the third well region with the third resist pattern as a mask to form a high-concentration impurity-doped layer of the first conduction-type in a deep portion of the third well which is spaced from the surface of the semiconductor substrate in a device region.

In the above-described method for fabricating the semiconductor device, it is preferable that the third resist pattern has a fifth opening formed in the same region as the second opening; and in the high-concentration impurity-doped layer forming step, the third impurity is doped in the regions of the second well and the third well with the third resist pattern as a mask to form high-concentration impurity-doped layers in deep portions of the second well and of the third well which are spaced from the surface of the semiconductor substrate in device regions.

In the above-described method for fabricating the semiconductor device, it is preferable that the high-concentration impurity-doped layers are formed immediately below device isolation regions defining the device regions.

The above-described object is also achieved by a method for fabricating a semiconductor device comprising: a first resist pattern forming step of forming a first resist pattern with a first opening on a semiconductor substrate of a first conduction-type; a first impurity doping step of doping a first impurity in the semiconductor substrate with the first resist pattern as a mask; a second resist pattern forming step of forming a second resist pattern with a second opening formed in a region other than a region of the first opening and with a third opening formed in a region within the first opening; a second impurity doping step of doping a second impurity with the second resist pattern as a mask; a device isolation film forming step of forming device isolation films which electronically isolate a plurality of semiconductor devices to be formed on a primary surface of the semiconductor substrate; and a well forming step of activating the doped first and second impurities to form a first well of the first conduction-type in the first opening, a second well of a second conduction-type in the second opening, and a third well of the second conduction-type in the first well in the third opening, the second impurity doping step at least including a first ion implanting step of implanting a small dose of ions at low acceleration energy, and a second ion implanting step of implanting a large dose of ions at high acceleration energy so that the second and the third wells have a impurity concentration of the second impurity which is higher at the deep portion of the semiconductor substrate than at the surface thereof.

In the above-described method for fabricating the semiconductor device, it is preferable that the first impurity doping step at least includes a third ion implanting step of implanting a small dose of ions at low acceleration energy, and a fourth ion implanting step of implanting a large dose of ions at high acceleration energy so that the first well has an impurity concentration which is higher at the deep portion of the semiconductor substrate than on the surface of the semiconductor substrate.

The above-described object is also achieved by a method for fabricating a semiconductor device comprising: a device isolation film forming step of forming device isolation films on a semiconductor substrate of a first conduction; a first resist pattern forming step of forming a first resist pattern with a first opening on the semiconductor substrate with the device isolation films formed thereon; a first impurity doping step of doping a first impurity in the semiconductor substrate with the first resist pattern as a mask; a second resist pattern forming step of forming a second resist pattern with a second opening formed in a second region other than the first region and with a third opening formed in a region within the first opening; and a second impurity doping step of doping a second impurity with the second resist pattern as a mask, a first well of the first conduction-type in the first opening, a second well of a second conduction-type in the second opening, and a third well of the second conduction-type in the first well in the third opening being formed without drive-in diffusion.

In the above-described method for fabricating the semiconductor device, it is preferable that the second impurity doping step is for implanting the second impurity below the device isolation films.

In the above-described method for fabricating the semiconductor device, it is preferable that the second impurity doping step at least includes a first ion implanting step of implanting a small dose of ions at low acceleration energy, and a second ion implanting step of implanting a large dose of ions at high acceleration energy so that the second well and the third well have a concentration of the second impurity which is higher at the deep portion of the semiconductor substrate than at the surface of the semiconductor substrate.

In the above-described method for fabricating the semiconductor device, it is preferable that the first impurity implanting step at least includes a third ion implanting step of implanting a small dose of ions at low acceleration energy, and a fourth ion implanting step for implanting a large dose of ions at high acceleration energy.

The above-described object is also achieved by a method for fabricating a semiconductor device comprising: a first resist pattern forming step of forming a first resist pattern with a first opening on a semiconductor substrate of a first conduction-type; a first impurity doping step of doping a first impurity in the semiconductor substrate with the first resist pattern as a mask; a drive-in diffusion step of diffusing the doped first impurity into the semiconductor substrate; a device isolation film forming step of forming device isolation films which electronically isolate a plurality of semiconductor device to be formed on a primary surface of the semiconductor substrate; a second resist pattern forming step of forming a second resist pattern with a second opening formed in a second region other than the first region and with a third opening formed in a region within the first opening; and a second impurity doping step of doping a second impurity with the second resist pattern as a mask, a first well of the first conduction-type in the first opening, a second well of a second conduction-type in the second opening, and a third well of the second conduction-type in the first well in the third opening being formed.

In the semiconductor device having triple wells according to the present invention, the high-concentration impurity-doped layers are formed in deep portion of the substrate than the device regions. Accordingly, in the case where the wells have a low surface impurity concentration so that the transistors have a low threshold voltage, the inner regions of the wells can independently have a high impurity concentration. As a result, punch-through between the source/drain diffused layer of the transistor formed in the well in a well (hereinafter called double wells), and the well outside of the double wells can be prevented. This structure is also effective to prevent latch-up.

The high-concentration impurity-doped layers formed immediately below the device isolation films can be used as channel stoppers for preventing the operation of parasitic transistors.

Because the inner wells of the double wells have a higher impurity concentration at the deep portion of the substrate than at the substrate surface, in a case where the surface impurity concentration of the inner wells is decreased so that the transistors have a low threshold voltage, punch-through between the source/drain diffused layer of the transistor formed in the inner well of the double wells, and the outer well of the double wells, can be prevented.

The wells, having a higher impurity concentration at the deep portion of the substrate than at the substrate surface, are formed by high-energy ion implantation, whereby high-temperature drive-in diffusion is not necessary to form the wells. As a result, lateral diffusion of the impurities can be reduced, which is effective to miniaturize the device.

The high-concentration impurity-doped layers are formed by ion implantation after formation of the device isolation films, whereby the high-concentration regions can be easily formed in deep portions of the substrate. As a result, even in a case that the surface impurity concentration of the wells is decreased so that the transistors have a low threshold voltage, the deep portions of the wells can independently have a high impurity concentration to prevent the punch-through problem.

Simultaneously with formation of the double wells, one of the wells of the CMOS is formed, whereby the process for forming the wells can be simplified.

The high-concentration impurity-doped layers are formed by ion implantation after formation of the device isolation films, and the high-concentration impurity-doped layers are formed immediately below the device isolation films in the device isolation regions, whereby the high-concentration impurity-doped layers function as channel stoppers which prevent operation of parasitic transistors.

The addition of the high-concentration impurity-doped layers adds only one step of ion implantation but can omit three steps of the conventional channel stopper formation, because the same mask layer as p-well implantation is used as a mask layer of the high-concentration impurity implantation. As a result, punch-through between the source/drain diffused layer of the transistor formed in the double wells and the outer well of the double wells, and operation of parasitic transistors can be prevented without increasing a total fabrication step number.

A combination of low energy ion implantation and high energy ion implantation is used in forming the inner well of the double wells, to form a well having an impurity concentration which is higher at the deep portion of the substrate, whereby without increasing a surface impurity concentration of the well, the impurity concentration at the deep portion of the well can be independently increased. As a result, punch-through between the source/drain diffused layer of the transistor or other high-concentration diffused layer formed in the double wells, and the outer well of the double wells can be prevented.

Formation of the n-wells by a plurality of ion implantation steps, including high-energy ion implantation makes, it possible to omit drive-in diffusion steps. This minimizes lateral diffusion of impurities, which effectively permits miniaturization of the device. Furthermore, the high-concentration impurity-doped layers can be formed at deep portion of the wells by high-energy ion implantation, whereby latch-up resistance can be improved.

The triple wells are formed by high-energy implantation after formation of the device isolation films, whereby drive-in diffusion step can be omitted, and latch-up resistance can be improved.

Because drive-in diffusion is not necessary, the impurity concentration below the device isolation films is kept high, whereby the step for ion implantation in the wells can use also as the step of the channel stoppers formation. This is effective to simplify fabrication and reduce the number of steps.

Impurities are implanted by a plurality of ion implantation steps in forming the well of the double wells, whereby the impurity concentration of the substrate surface and a concentration of the deep portions of the substrate can be adjusted independently of each other. This facilitates alignment of transistor characteristics and optimization of channel stoppers.

The outer well of the double wells, and one of the wells of the CMOS can be formed by one lithography step by implanting ions by a plurality of ion implanting operations when the outer well of the double wells is formed. Accordingly, formation of the triple wells, and the channel stoppers, can be formed by two lithography steps. In comparison with the conventional method for fabricating a semiconductor device, one lithography step can be omitted.

BRIEF DESCRIPTION OF THE DRAWINGS

FIGS. 6A and 6B are sectional views of the semiconductor device according to the first embodiment in a step of the method for fabricating the same explaining the method (Part 5).

FIGS. 9A and 9B are sectional views of the semiconductor device according to the second embodiment in a step of the method for fabricating the same explaining the method (Part 1).

FIGS. 10A and 10B are sectional views of the semiconductor device according to the second embodiment in a step of the method for fabricating the same explaining the method (Part 2).

FIGS. 11A and 11B are sectional views of the semiconductor device according to the second embodiment in a step of the method for fabricating the same explaining the method (Part 3).

FIGS. 16A and 16B are sectional views of the semiconductor device according to the third embodiment in a step of the method for fabricating the same explaining the method (Part 1).

FIGS. 17A and 17B are sectional views of the semiconductor device according to the third embodiment in a step of the method for fabricating the same explaining the method (Part 2).

DETAILED DESCRIPTION OF THE PREFERRED EMBODIMENTS

Figure 1:
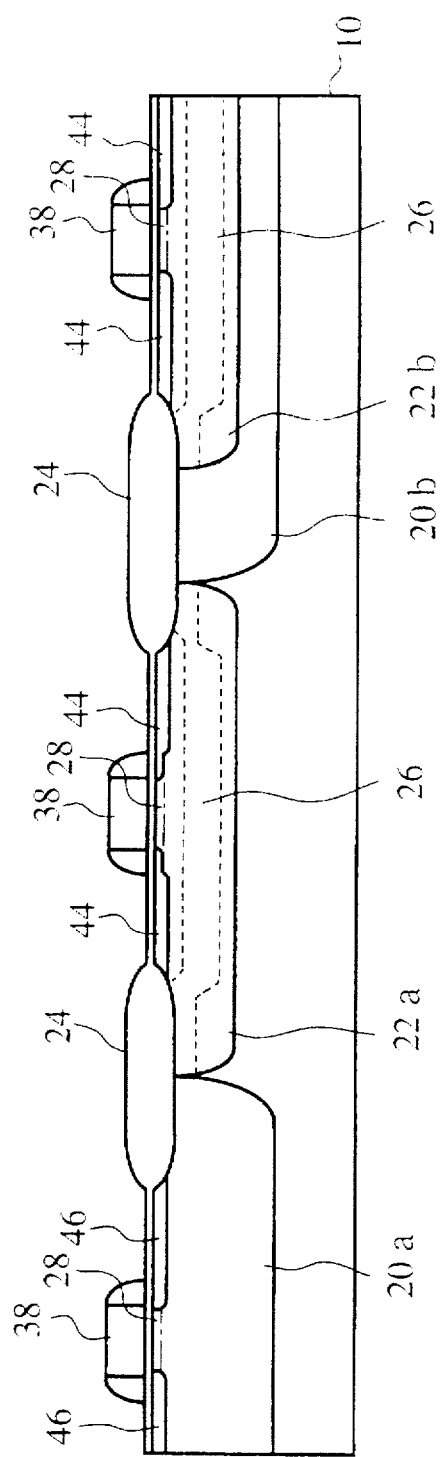
FIG. 1 is a diagrammatic sectional view explaining the structure of the semiconductor device according to the first embodiment of the present invention.

The semiconductor device and a method for fabricating the same according to a first embodiment of the present invention will be explained with reference to FIGS. 1 to 7B. FIG. 1 is diagrammatic sectional view of the semiconductor device according to the first embodiment explaining its structure. FIGS. 2A to 7B are sectional views of the semiconductor device according to the first embodiment showing the steps of the method for fabricating the same.

By means of the present embodiment, a semiconductor device with a triple-well structure which can prevent punch-through between the source/drain diffused layers of an n-type transistor formed in a p-well in an n-well, and the n-well immediately below the p-well, when the surface impurity concentration of the p-well is low for achieving a low threshold voltage of the transistor, and a method for fabricating the same, will be explained.

The semiconductor device according to the present embodiment is characterized in that high-concentration impurity-doped layers are formed in the regions in which the p-wells are formed, below device isolation films and at deep portions of the p-wells in the device regions.

That is, as shown in FIG. 1, n-wells 20a, 20b are formed on a silicon substrate 10. A p-well 22a is formed in a region of the silicon substrate 10 where the n-wells 20a, 20b are not formed. The p-well 22a can be altered to p-substrate, if necessary, by using the same scope of this invention. Furthermore, both p-well 22a and p-type Si substrate can be used to provide two types or different threshold voltage transistors without any additional process steps. A p-well 22b is formed in the n-well 20b. In this triple-well structure, the high-concentration impurity-doped layers 26 are formed in the p-wells 22a, 22b. The high-concentration impurity-doped layers 26 are formed immediately below the device isolation films 24 and at deep portions of the p-wells in the device regions.

Gate electrodes 38 are formed on the respective wells through respective gate oxide films 28. Source/drain diffused layers 44, 46 are formed on both sides of each gate electrode 38. Thus, MOS transistors are formed.

Next, the method for fabricating the semiconductor device according to the present embodiment will be explained.

Figure 2A:
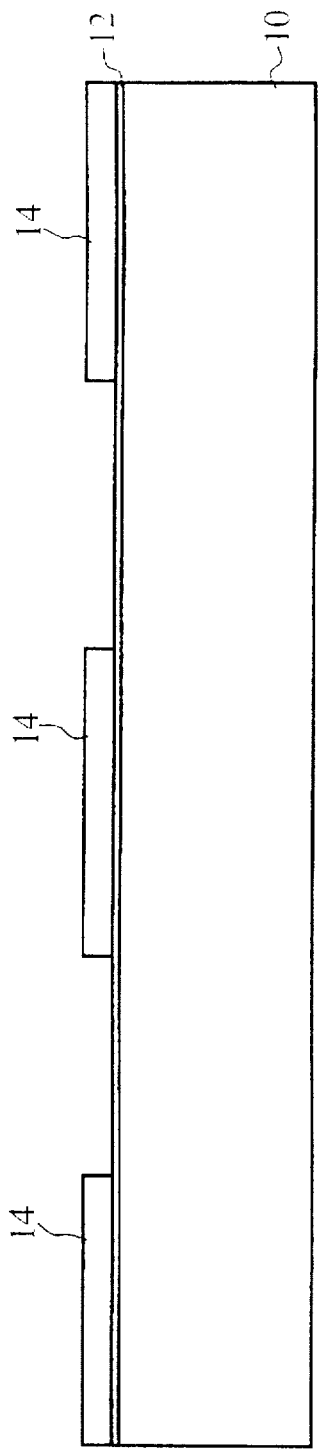
FIGS. 2A and 2B are sectional views of the semiconductor device according to the first embodiment in a step of the method for fabricating the same explaining the method (Part 1).

An about 5 nm-thick thermal oxide film 12 is formed on a (100) oriented p-type silicon substrate 10 having a resistivity of 10 $\Omega$-cm, and then an about 100 nm-thick silicon nitride film 14 is deposited by chemical vapour deposition (CVD). Next, the deposited silicon nitride film 14 is patterned for device isolation by lithography and etching (FIG. 2A).

Figure 2B:
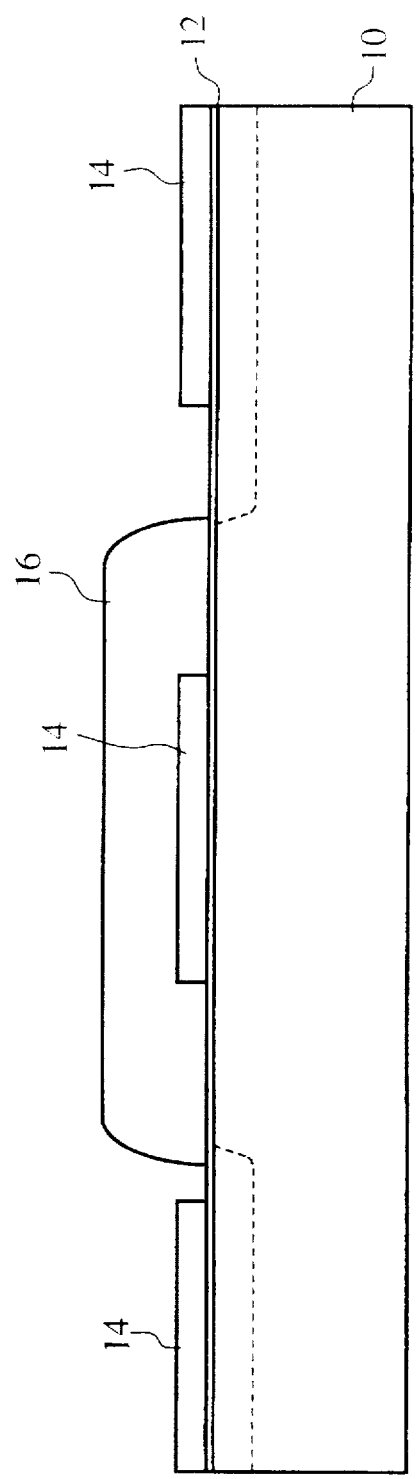

With the selectively formed resists 16 as a mask, a $2 \times 10^{13}$ ions cm$^{-2}$ dose of phosphorus (P) ions is implanted at a 180 keV acceleration energy in regions for the n-wells to be formed in (FIG. 2B). The dose for formation of the n-wells is set so that the field threshold voltage of p-type parasitic transistors to be formed in the n-wells can be sufficiently lowered than the operating voltages.

Figure 3A:
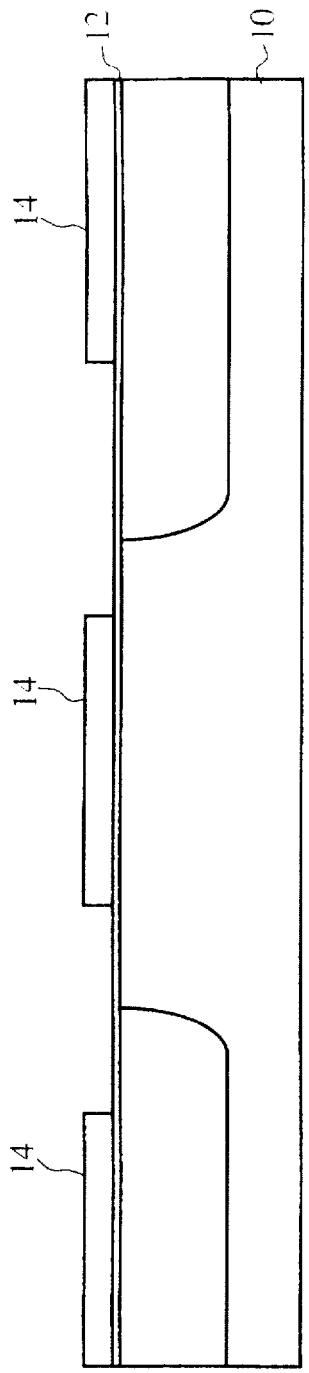
FIGS. 3A and 3B are sectional views of the semiconductor device according to the first embodiment in a step of the method for fabricating the same explaining the method (Part 2).

Following removal of the resist 16, the implanted P ions are driven in by a 300 minute-thermal diffusion at 1150° C. (FIG. 3A).

Figure 3B:
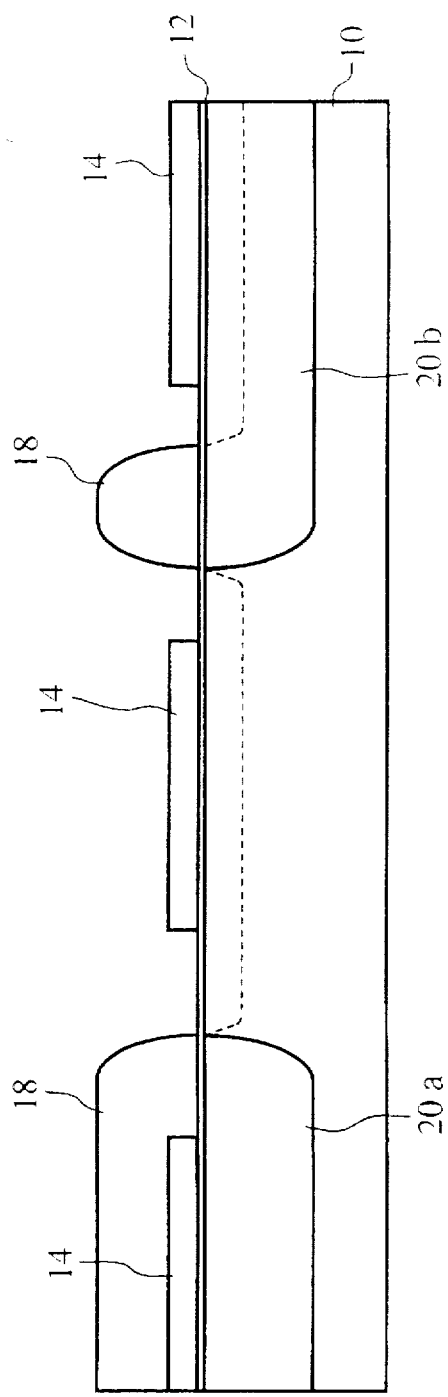

Then, with the selectively formed resists 18 as a mask, a $1.3 \times 10^{13}$ ions cm$^{-2}$ dose of B ions is implanted at a 180 keV acceleration energy in regions for the p-wells to be formed in (FIG. 3B). The dose for formation of the p-wells is set so that when a dose which is equal to a dose which results in the required threshold voltage of the p-type transistor to be formed in the n-well 20a is implanted, in controlling a threshold voltage, in the region for the p-well 22a to be formed in, the n-type transistor to be formed in the p-well 22a has the required threshold voltage.

Figure 4A:
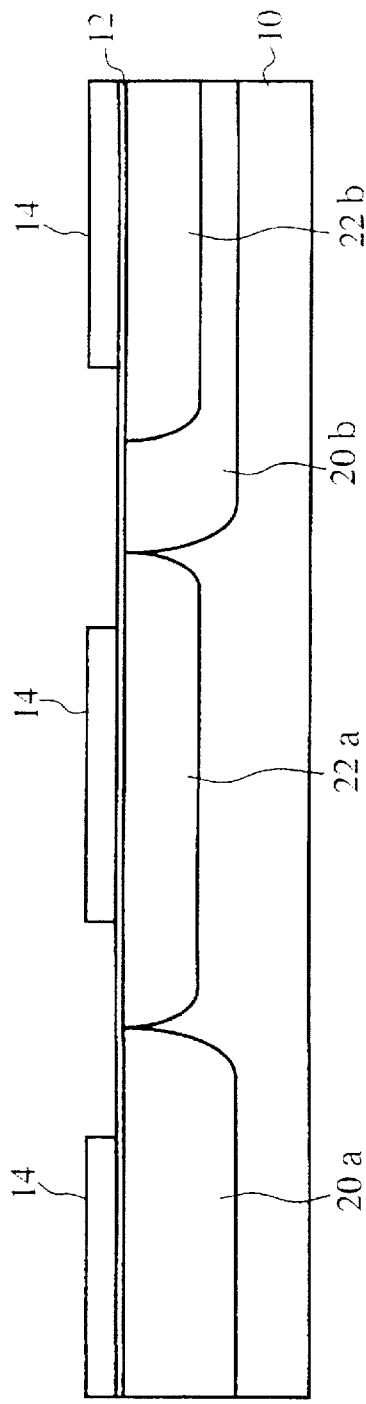
FIGS. 4A and 4B are sectional views of the semiconductor device according to the first embodiment in a step of the method for fabricating the same explaining the method (Part 3).

After the resist 18 is removed, the B and P atoms are thermally diffused for 30 minutes at 1150° C. By this heat treatment, three kinds of wells, the n-well 20a, the p-well 22a, and the p-well 22b in the n-well 20b, are formed (FIG. 4A).

Figure 4B:
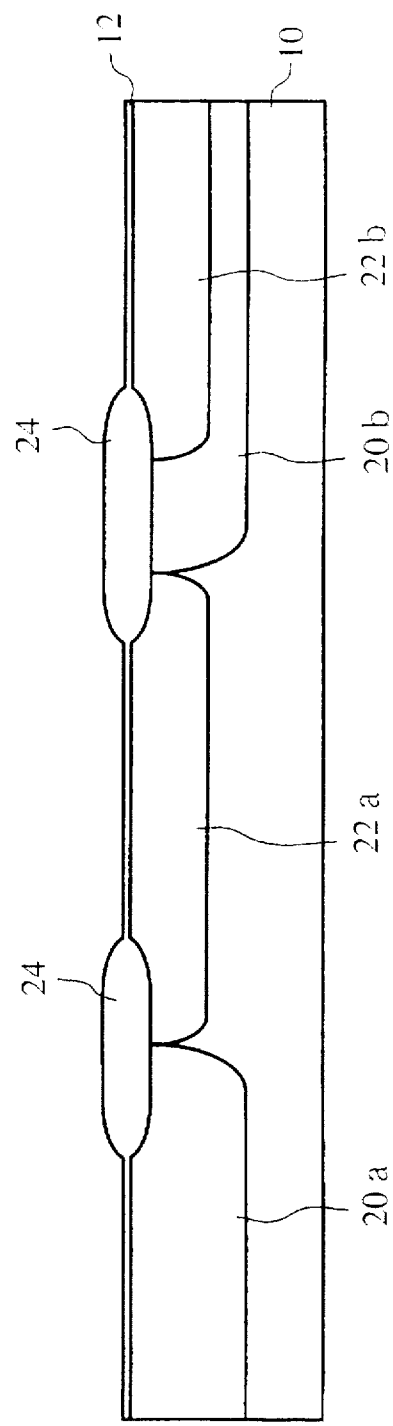

Then, with the patterned silicon nitride film 14 as a mask, thermal oxidation is conducted in a wet atmosphere to locally form the device isolation films 24 of an about 350 nm-thick, and then the silicon nitride film 14 is etched off (FIG. 4B).

Figure 5A:
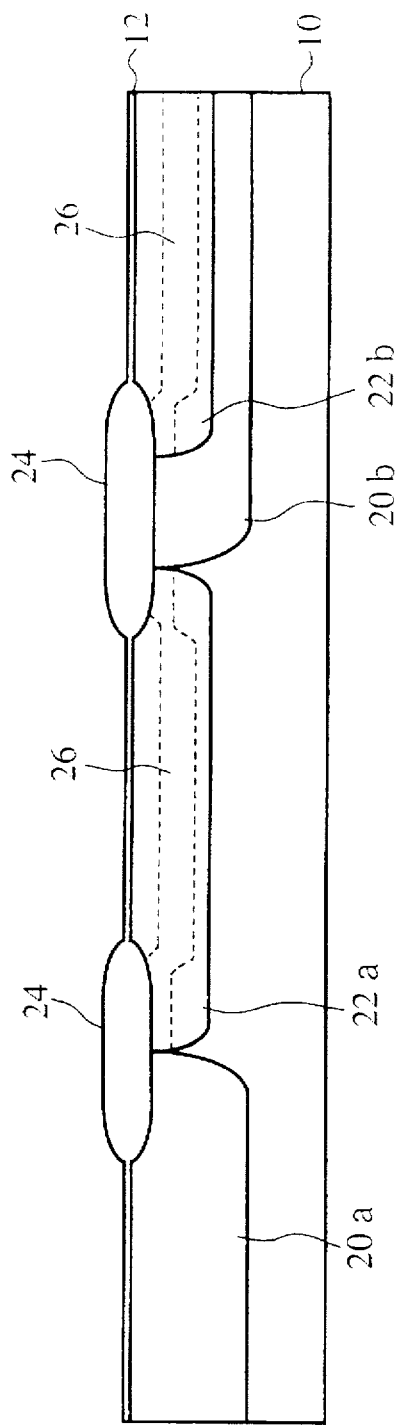
FIGS. 5A and 5B are sectional views of the semiconductor device according to the first embodiment in a step of the method for fabricating the same explaining the method (Part 4).

Then, with selectively formed resists (not shown) as a mask, a $4 \times 10^{12}$ ions cm$^{-2}$ dose of B ions is implanted at a 140 keV acceleration energy in the regions of the p-wells 22a, 22b (FIG. 5A). By this ion implantation, the high-concentration impurity-doped layers 26 are formed immediately below the device isolation films and at deep portion of the device regions in the p-wells 22a, 22b.

The thus-formed high-concentration impurity-doped layers 26 formed immediately below the device isolation films 24 function as channel stoppers which prohibit the operation of n-type parasitic transistors to be formed in the p-wells. The high-concentration impurity-doped layers 26 formed at deep portions of the device regions function as punch-through stoppers which prevent punch-through between the source/drain diffused layers 44 of the transistor formed in the p-well 22b, and the n-well 20b.

Figure 5B:
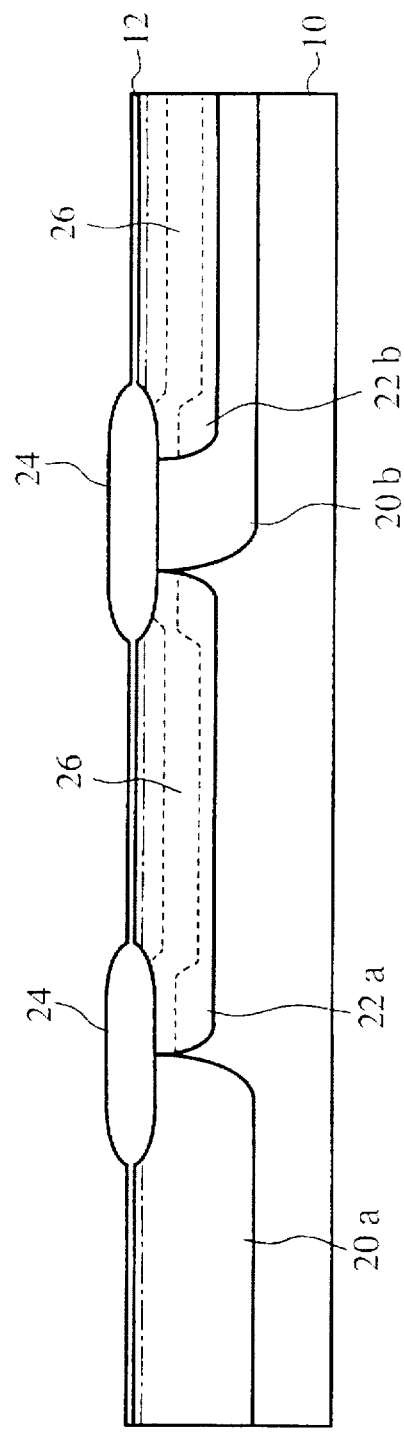

After the resists are removed, a $2 \times 10^{12}$ ions cm$^{-2}$ dose of B ions is implanted at an 18 keV acceleration energy so that the p-type transistor to be formed in the n-well 20a, the n-type transistor to be formed in the p-well 22a, and the n-type transistor to be formed in the p-well 22b in the n-well 20b have the required threshold voltages. (FIG. 5B).

Then, the transistors are formed by the usual process for fabricating a MOS transistor.

For example, the thermal oxide film 12 is etched off, and then a gate oxide film 28 is formed by thermal oxidation. Then, a polysilicon film 30 is deposited on the gate oxide film 28 by CVD and doped with P ions to be made less resistant (FIG. 6A).

Next, with selectively formed resists (not shown) as a mask, the polysilicon film 30 is patterned by reactive ion etching (RIE) to form the gate electrodes (FIG. 6B).

Following removal of the resists, with selectively formed resists (not shown) as a mask, P ions are implanted in the regions for the n-type transistors to form low impurity concentration regions 40 which are to be LDDs (Lightly Doped Drains).

Figure 7A:
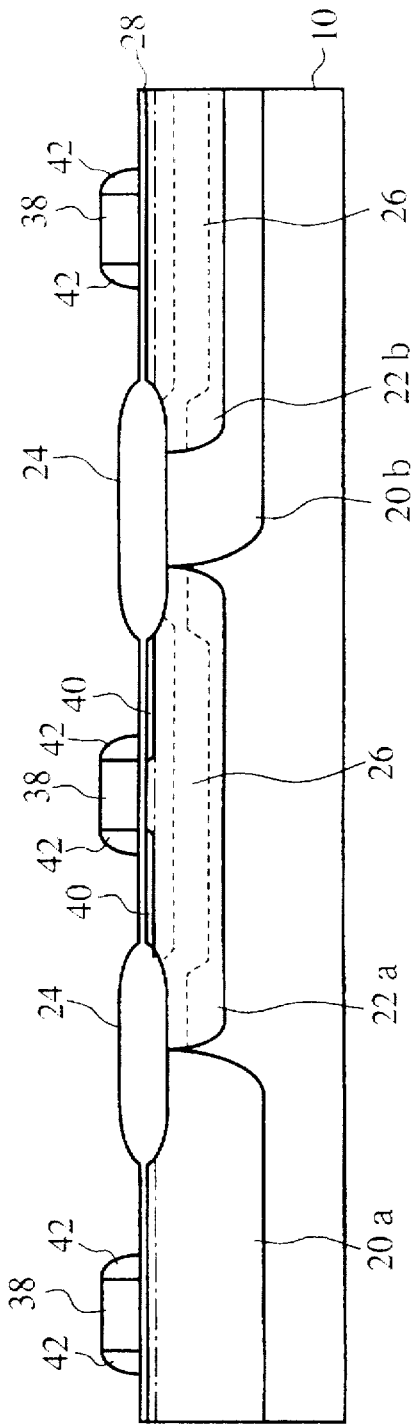
FIGS. 7A and 7B are sectional views of the semiconductor device according to the first embodiment in a step of the method for fabricating the same explaining the method (Part 6).
Figure 7B:
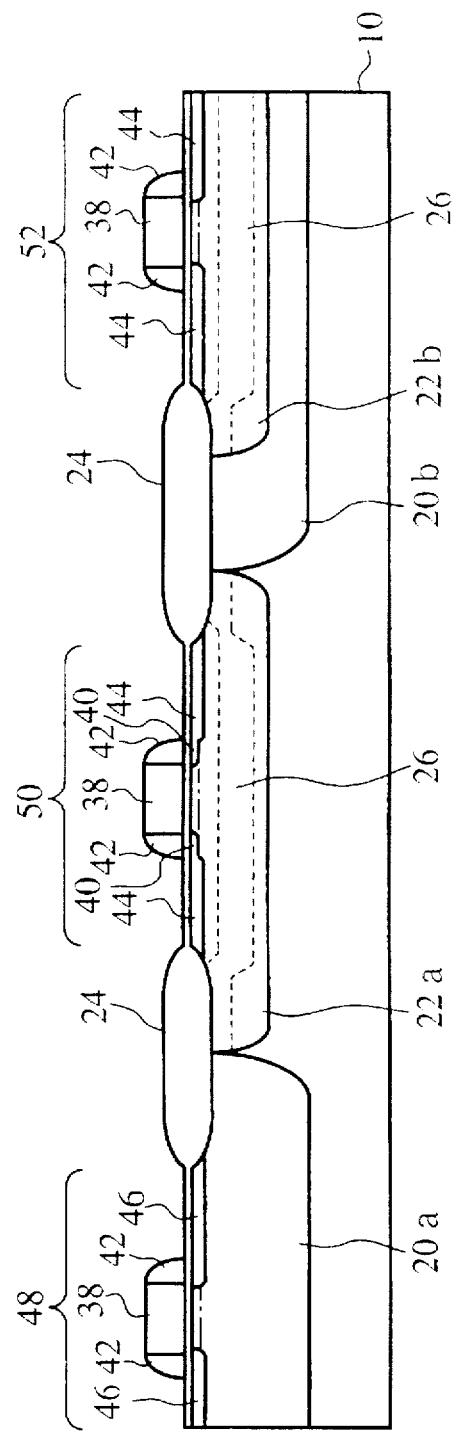

Following removal of the resist films, an oxide film is deposited by CVD and is etched back by RIE to form sidewalls 42 (FIG. 7A).

Subsequently with selectively formed resists (not shown) as a mask, arsenic (As) ions are implanted in the regions for the n-type transistors to be formed in to form source/drain diffused layers 44 of the n-type transistors.

After the resists are removed, new resists (not shown) are selectively formed, and boron fluoride (BF$_2$) ions are implanted in the region for the p-type transistor to be formed in, and source/drain diffused layers 46 of the p-type transistor are formed.

Thus, three kinds of transistors: the p-type transistor 48 in the n-well 20a, the n-type transistor 50 in the p-well 22a, and the n-type transistor 52 in the p-well 22b in the n-well 20b, are formed.

As described above, in the method for fabricating the semiconductor device according to the present embodiment, the high-concentration impurity-doped layers are formed at portions deeper than the device regions. As a result, even in the case that a low surface impurity concentration of the p-wells is required for a low threshold voltage of the transistors, the deep portions of the p-wells can independently have a high impurity concentration without raising the low surface impurity concentration of the p-wells. Thus, punch-through between the source/drain diffused layers of the n-type transistor or the other high-concentration diffused layers formed in the p-well in the n-well, and the n-wells can be prevented.

The high-concentration impurity-doped layers formed in the wells are formed by ion implantation after the device isolation films are formed. Accordingly, the high-concentration impurity-doped layers can be formed deep in the wells in the device regions, and in the device isolation regions they can be formed immediately below the device isolation films. The high-concentration impurity-doped layers can also function as channel stoppers which prohibit operation of n-type parasitic transistors to be formed in the p-wells.

The inclusion of the step of forming the high-concentration impurity-doped layers adds the three steps of the lithography step, the ion implantation step and the ashing step, but can omit the three conventional steps for the formation of the channel stoppers. That is, in the above-described fabrication process, the device isolation, the triple wells formation, the transistor threshold voltage control, the channel stoppers formation, and the punch-through prevention can be completed by four lithographic operations without increasing the process steps.

By means of the above-described embodiment, a method has been explained for fabricating the semiconductor device in which, in addition to the usual n-wells and p-wells being formed therein, a p-well additionally formed in the n-well. However, the present invention is also applicable to a method for fabricating the semiconductor device having a triple-well structure with an n-well being additionally formed in a p-well.

The formation of the wells, and the device isolation, are conducted in separate steps, and the device isolation films 24 are formed by thermal oxidation after impurities for the formation of the wells are driven in by diffusion. But the drive-in diffusion, and the formation of the device isolation films, may be continuously conducted in the same diffusion furnace. In this case, the diffusion is switched to oxidation by changing a furnace temperature and the atmosphere. When the wells can be sufficiently formed only by impurity diffusion by thermal oxidation, the device isolation step is only conducted without the well diffusion step. Such a process can have a shorter total processing time, and the device can have higher through-puts and lower fabrication costs.

Next, the semiconductor device and a method for fabricating the same according to a second embodiment of the present invention will be explained with reference to FIGS. 8A to 12.

Figure 8A:
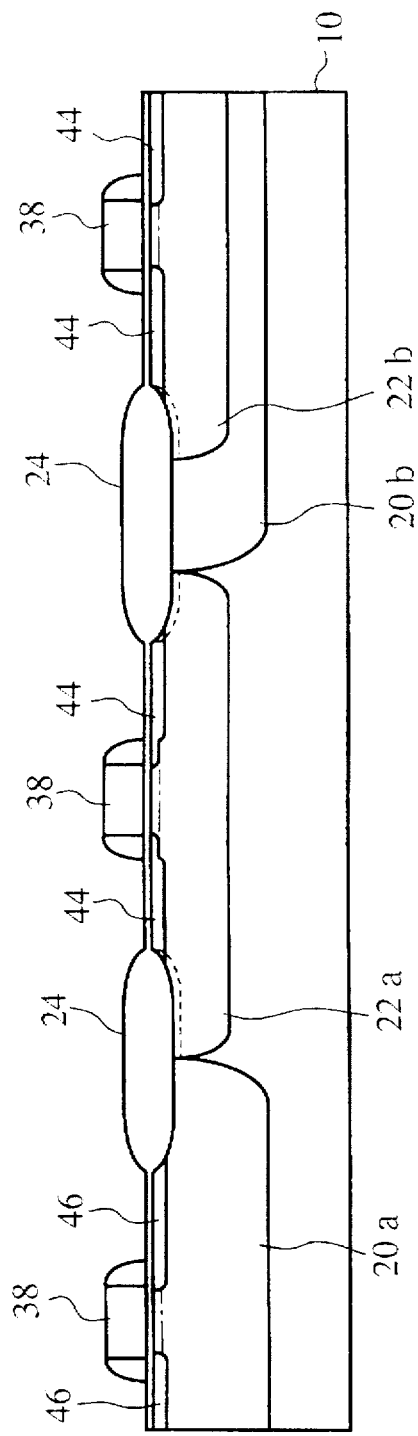
FIG. 8A is a diagrammatic sectional view explaining the structure of the semiconductor device according to a second embodiment of the present invention.
Figure 8B:
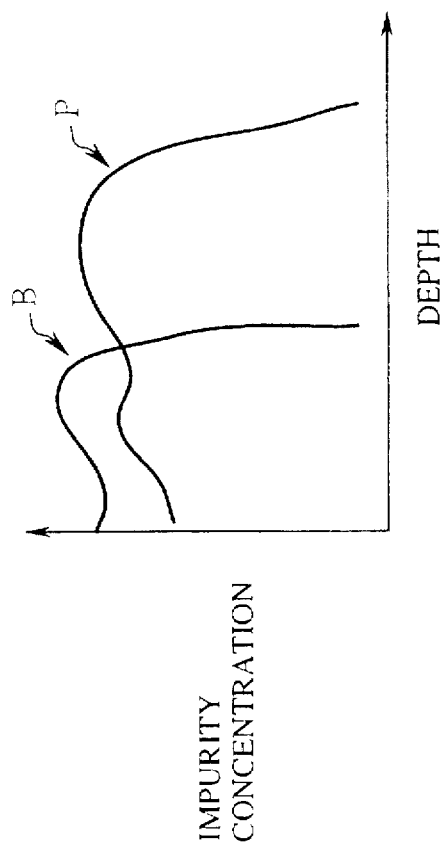
FIG. 8B is a graph of the impurity distributions of the double well according to the second embodiment of the present invention.

FIG. 8A is a diagrammatic sectional view explaining the structure of the semiconductor device according to the present embodiment. FIG. 8B is a graph of the impurity distributions of the double well according to the present embodiment. FIGS. 9A to 12 are sectional views of the semiconductor device showing the steps of the method for fabricating the same.

The present embodiment provides, as the first embodiment shown in FIG. 1, a semiconductor device which can prevent punch-through between the source/drain diffused layers of an n-type transistor formed in a p-well in an n-well, and the n-well immediately below the p-well, and a method for fabricating the semiconductor device.

The semiconductor device according to the present embodiment is characterized in that the impurity concentration of deep portions of the p-wells is higher than the surface impurity concentration of the p-wells.

As shown in FIG. 8A, n-wells 20a, 20b are formed in a silicon substrate 10. A p-well 22a is formed in a region where the n-wells 20a, 20b are not formed. The p-well 22a can be altered to p-type Si substrate as explained in the first embodiment. A p-well 22b is formed in the n-well 20b. As shown in FIG. 8B, the impurity B distribution of the p-well 22b in the n-well 20b is higher at the deep portion of the substrate than at the surface thereof.

Then the method for fabricating the semiconductor device according to the present embodiment will be explained.

First, an about 5 nm-thick thermal oxide film 12 is formed on a (100) oriented p-type silicon substrate having a resistivity of 10 Ω-cm, and next an about 100 nm-thick silicon nitride film 14 is deposited by CVD. Then, the deposited silicon nitride film 14 is patterned by lithography and etching for device isolation (FIG. 9A).

Then, with a selectively formed resist 16 as a mask, a $1\times10^{13}$ ions cm$^{-2}$ dose of P ions is implanted in regions for the n-wells to be formed in at 180 keV energy, and a $1\times10^{13}$ ions cm$^{-2}$ dose of P ions is implanted at 1 MeV energy. The dose for formation of the n-wells is set so that the field threshold voltage of the p-type parasitic transistors to be formed in the n-wells can be sufficiently lower than the operating voltages. Thus, it makes formation of deep wells by drive-in diffusion unnecessary that the n-wells are formed by the ion implantation at low and high energies, and the deep portion of the substrate has a high impurity concentration (FIG. 9B).

After the resist 16 is removed, with selectively formed resists 18 as a mask, a $7\times10^2$ cm$^{-2}$ dose of boron ions and a $1\times10^{13}$ cm$^{-2}$ of boron ions are continuously implanted in regions for the p-wells to be formed in respectively at 140 keV and 400 keV (FIG. 10A). The dose for formation of the p-wells is set so that when a dose which is equal to a dose which results in a required threshold voltage of the p-type transistor to be formed in the n-well 20a is implanted in the region for the p-well 22a to be formed in, the n-type transistor to be formed in the p-well 22a has a required threshold voltage.

The formation of the wells by such a combination of high-energy ion implantation and low-energy ion implantation can facilitate formation of wells having a higher impurity concentration at portions thereof in the substrate.

Following removal of the resist 18, a heat treatment is conducted to activate the implanted B and P atoms to form the n-well 20a, the p-well 22a, and the p-well 22b in the n-well 20b (FIG. 10B).

Next, with selectively formed resists 32 and the patterned silicon nitride film 14 as masks, a $5\times10^{13}$ ions cm$^{-2}$ of B ions is implanted at 18 keV to form the channel stoppers for preventing operation of an n-type parasitic transistors (FIG. 11A).

After the resists 32 are removed, with the patterned silicon nitride film 14 as a mask, thermal oxidation is conducted in a wet atmosphere to locally form about 350 nm-thick device isolation films 24, and the silicon nitride film 14 is etched off. Simultaneously, with the oxidation, channel stoppers are formed immediately below the device isolation films 24 in the p-wells 22a, 22b.

Then, a $2\times10^{12}$ ions cm$^{-2}$ dose of B ions is implanted at 18 keV energy so that a p-type transistor to be formed in the n-well 20a, an n-type transistor to be formed in the p-well 22a and, an n-type transistor to be formed in the p-well 22b in the n-well 20b have required the threshold voltage (FIG. 11B).

Figure 12:
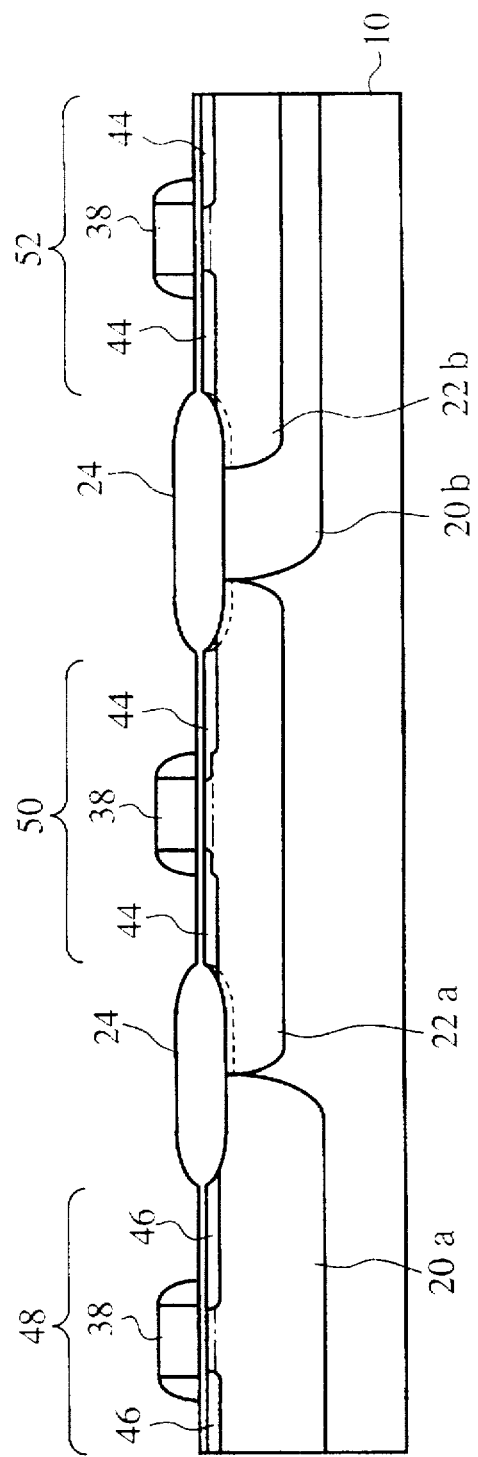
FIG. 12 is a sectional view of the semiconductor device according to the second embodiment in a step of the method for fabricating the same explaining the method (Part 4).

Subsequently, transistors are formed by following, e.g., the same steps as those of FIGS. 6A to 7B of the first embodiment, and three kinds of transistors: the p-type transistor 48 in the n-well 20a, the n-type transistor 50 in the p-well 22a, and the n-type transistor 52 in the p-well 22b in the n-well 20b, are formed (FIG. 12).

Thus, in the method for fabricating the semiconductor device according to the present embodiment by which triple wells are formed, wells having a higher impurity concentration at portions thereof in the substrate are formed by a combination of low-energy ion implantation and high-energy ion implantation. Accordingly even in a case where the p-wells must have a low surface impurity concentration so that the transistors have low threshold voltages, the portions of the wells in the substrate can have a high impurity concentration independently of the high surface impurity concentration of the wells. As a result, punch-through between the source/drain diffused layers of the n-type transistor or the other high-concentration diffused layers in the p-well in the n-well, and the n-well can be prevented.

The method for fabricating the semiconductor device according to the present embodiment includes the high-energy ion implantation step in addition to the steps of the conventional method for fabricating a semiconductor device, but does not include additional lithography steps. That is, the device isolation, the formation of the triple wells, the control of threshold voltages of the transistors, formation of the channel stoppers, and the punch-through prevention can be achieved by four lithographic operations.

By means of the second embodiment, a method has been explained for fabricating the semiconductor device in which, in addition to the usual n-wells and p-wells being formed therein, a p-well is additionally formed in the n-well. However, the present invention is applicable to a method for fabricating the semiconductor device having a triple-well structure with an n-well being additionally formed in a p-well.

In the second embodiment, in forming the n-wells, the low energy ion implantation and high-energy ion implantation are used, and the drive-in diffusion step is omitted. But the low-energy ion implantation step may be replaced by the drive-in diffusion step to form the n-wells.

Next, the method for fabricating the semiconductor device according to a third embodiment of the present invention will be explained with reference to FIGS. 13 to 19.

Figure 13:
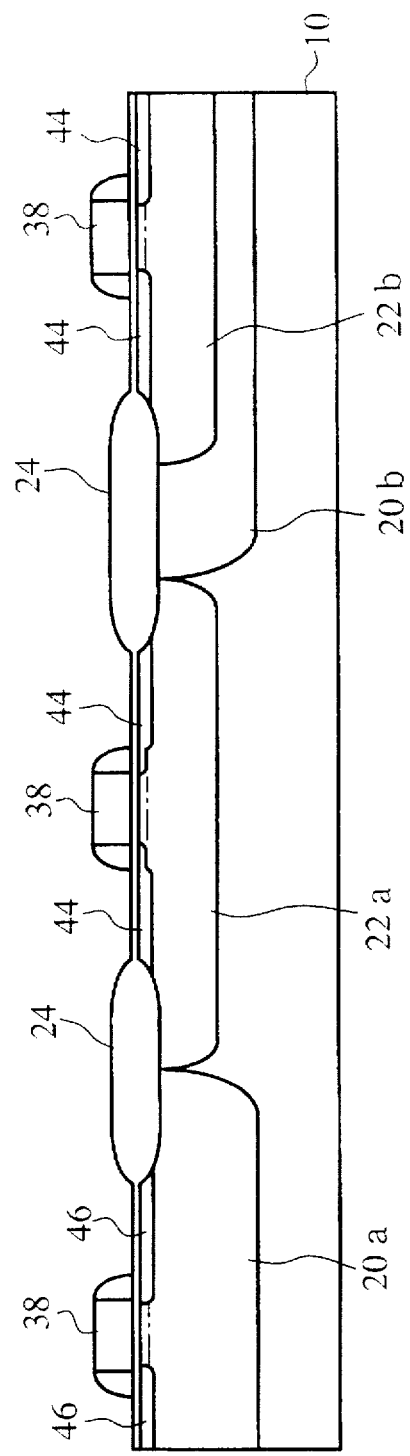
FIG. 13 is a diagrammatic sectional view explaining the structure of the semiconductor device according to a third embodiment of the present invention.

FIG. 13 is a diagrammatic sectional view explaining the structure of the semiconductor device according to the present embodiment. FIGS. 14A to 15B show views of impurity distributions of triple wells. FIGS. 16A to 19 are sectional views of the semiconductor device showing the steps of the method for fabricating the semiconductor device according to the present embodiment.

The present embodiment provides a method for fabricating the semiconductor device by which triple wells are formed by high-energy ion implantation and which concurrently conducts formation of the wells and channel stoppers, so that the semiconductor device can be realized by a smaller number of lithography steps.

Figure 14A:
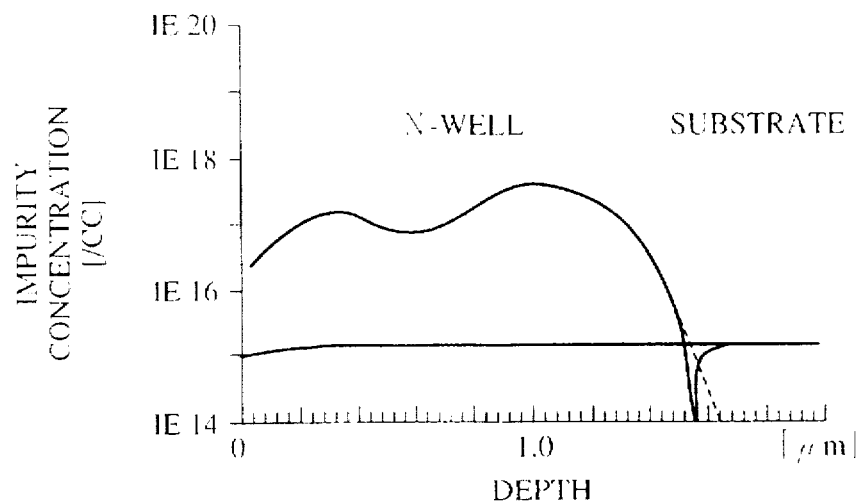
FIGS. 14A to 14C are views of distributions of impurities of the triple wells of the semiconductor device according to the third embodiment of the present invention.
Figure 14B:
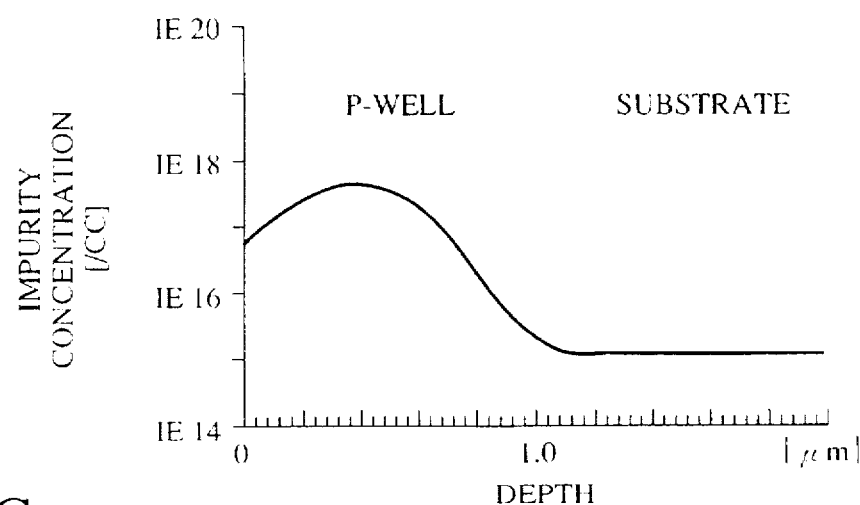
Figure 14C:
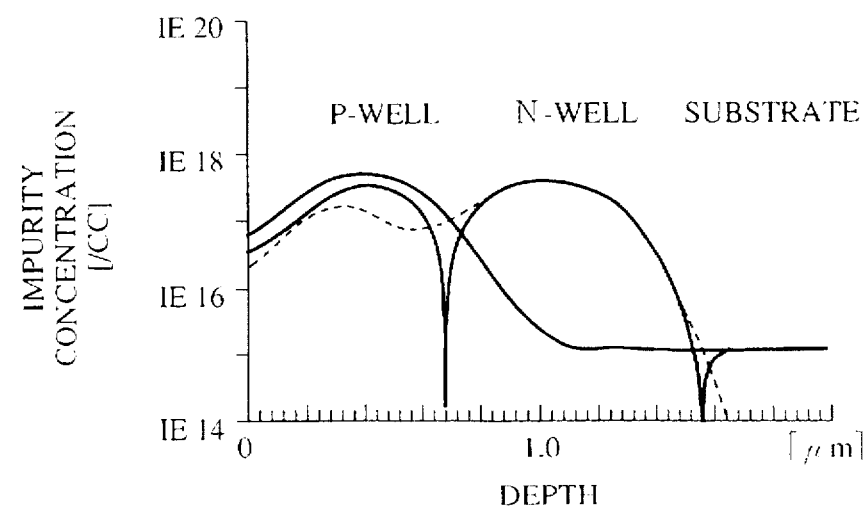
Figure 15A:
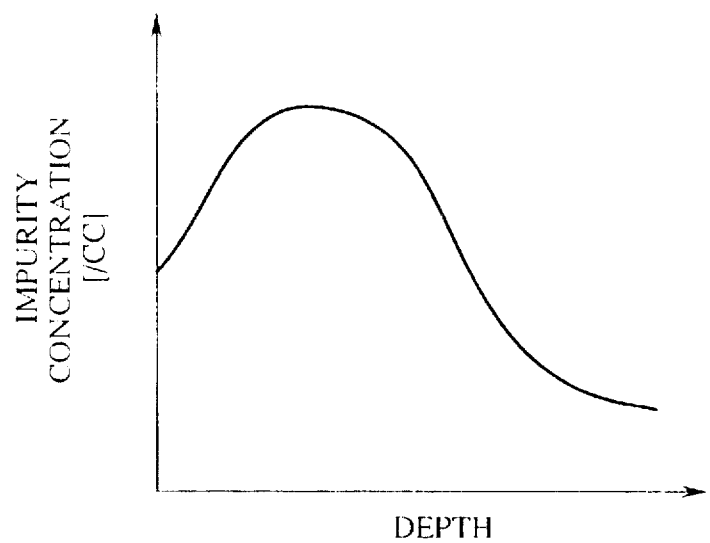
FIGS. 15A and 15B are views of an impurity concentration of the p-wells in the device regions and the device isolation regions.
Figure 15B:
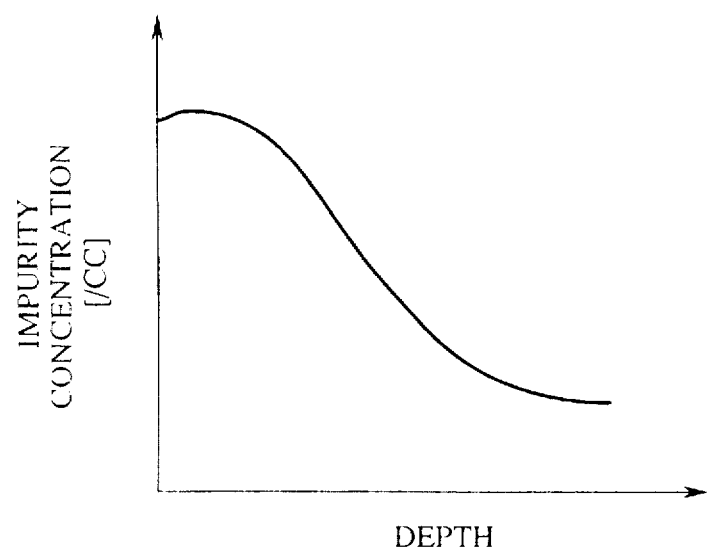

As shown in FIG. 13, n-wells 20a, 20b are formed in a silicon substrate 10. A p-well 22a is formed in a region where the n-wells 20a, 20b are not formed. The p-well 22a can be altered to p-type Si substrate as explained in the first and second embodiment. A p-well 22b is formed in the n-well 20b. The n-wells 20a, 20b of these triple wells are formed by two ion implanting operations, and have an impurity distribution having two peaks (FIG. 14A). The p-wells 22a and 22b have an impurity concentration peak inside the substrate (FIGS. 14B and 14C). The p-wells 22a, 22b have, in the device regions, an impurity concentration peak inside the substrate (FIGS. 15A), but, in the device isolation regions, an impurity concentration peak immediately below the device isolation films (FIG. 15B).

Then, the method for fabricating the semiconductor device according to the present embodiment will be explained.

First, an about 5 nm-thick thermal oxide film 12 is formed on a (100) oriented p-type silicon substrate 10 having a resistivity of a 10 Ω-cm, and then an about 100 nm-thick silicon nitride film 14 is deposited by CVD. The deposited silicon nitride film 14 is patterned by lithography and etching into a device isolation pattern (FIG. 16A).

After the resist is removed, with the patterned silicon nitride film 14 as a mask, thermal oxidation is conducted in a wet atmosphere to locally form about 350 nm-thick device isolation films 24, and the silicon nitride film 14 is etched off (FIG. 16B).

Then, with the selectively formed resists 16 as a mask, a dose of $2 \times 10^{13}$ ions $cm^{-2}$ of P ions and a dose of $5 \times 10^{12}$ ions $cm^{-2}$ of P ions are continuously implanted at 800 keV energy and 250 keV energy respectively in regions for the n-wells to be formed in. The dose for the formation of the n-wells is set so that the field threshold voltage of a p-type parasitic transistor to be formed in the n-wells can be sufficiently lower than the operating voltages. With the formation of the n-wells by the high energy ion implantation, the n-wells can have high-concentration regions in the silicon substrate, which makes drive-in diffusion unnecessary (FIG. 17A).

After the resists 16 are removed, with selectively formed resists 18 as a mask, a $2 \times 10^{13}$ ions $cm^{-2}$ dose of B ions is implanted at 120 keV energy in regions for the p-wells to be formed in (FIG. 17B). The energy is determined considering the field oxide thickness and the p-well depth. So, in case of thinner field oxide such as 250 nm, the well is formed by two times of ion implantation such as 100 keV $7 \times 10^{12}$ $cm^{-2}$ and 180 keV $1 \times 10^{13}$ $cm^{-2}$. Anyhow, the p-well implantation can be done by using conventional equipment. The dose for the formation of the p-wells is set so that the n-type transistor to be formed in the p-well 22a has the required threshold voltage when a dose equal to the dose which results in the required threshold voltage of the p-type transistor formed in the n-well 20a, is implanted in the p-well 22a. No drive-in diffusion follows the ion implantation in the p-well regions.

The thus-formed p-wells 22a, 22b have the impurity profiles of FIG. 15B. That is, the impurity concentration immediately below the device isolation films can be made sufficiently high because the ion implantation is conducted after the device isolation films are formed, and no drive-in diffusion is conducted (FIG. 15B). Accordingly, the step of forming channel stoppers for prohibiting the operation of the n-type parasitic transistor can be omitted.

Figure 18A:
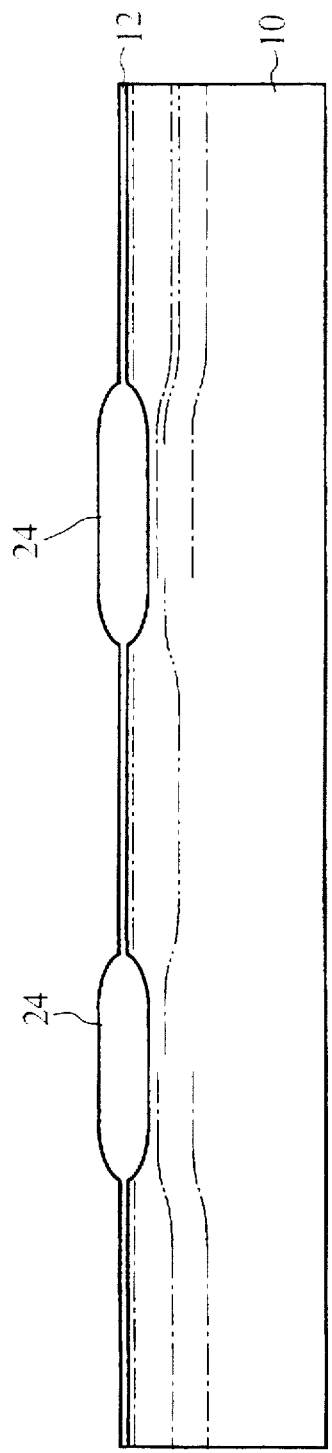
FIGS. 18A and 18B are sectional views of the semiconductor device according to the third embodiment in a step of the method for fabricating the same explaining the method (Part 3).
Figure 18B:
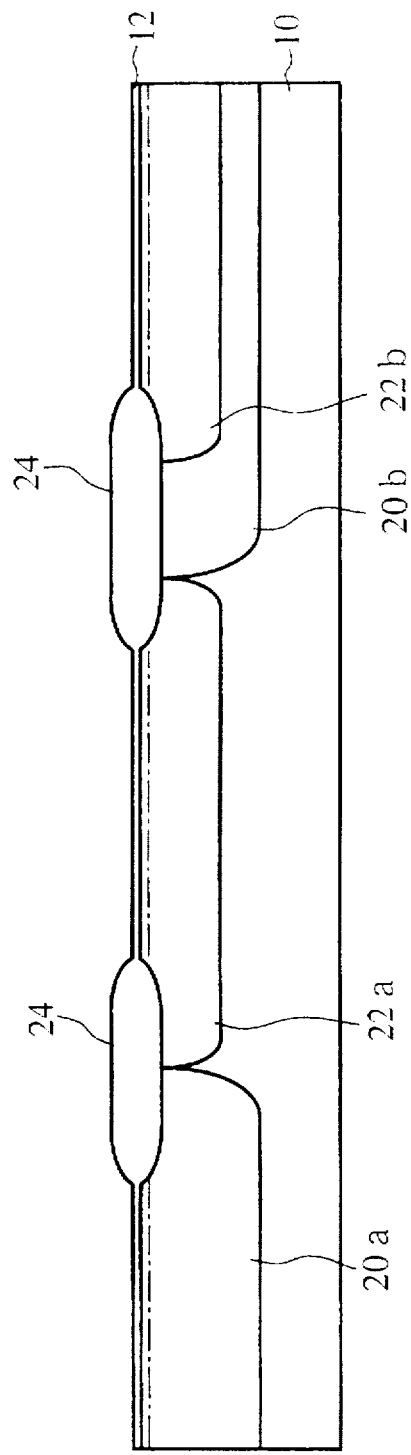

After the resist 18 is removed, a $2 \times 10^{12}$ ions $cm^{-2}$ dose of B ions is implanted at 18 keV acceleration energy so that the p-type transistor to be formed in the n-well 20a, the n-type transistor to be formed in the p-well 22a, and the n-type transistor to be formed in the p-well 22b in the n-well 20b have the required threshold voltage values (FIG. 18A). The implanted impurities are activated by the following gate oxidation step and other heat treatment steps, and the triple wells (the n-well 20a, the p-well 22a, and the p-well 22b in the n-well 20b) are formed (FIG. 18B).

Figure 19:
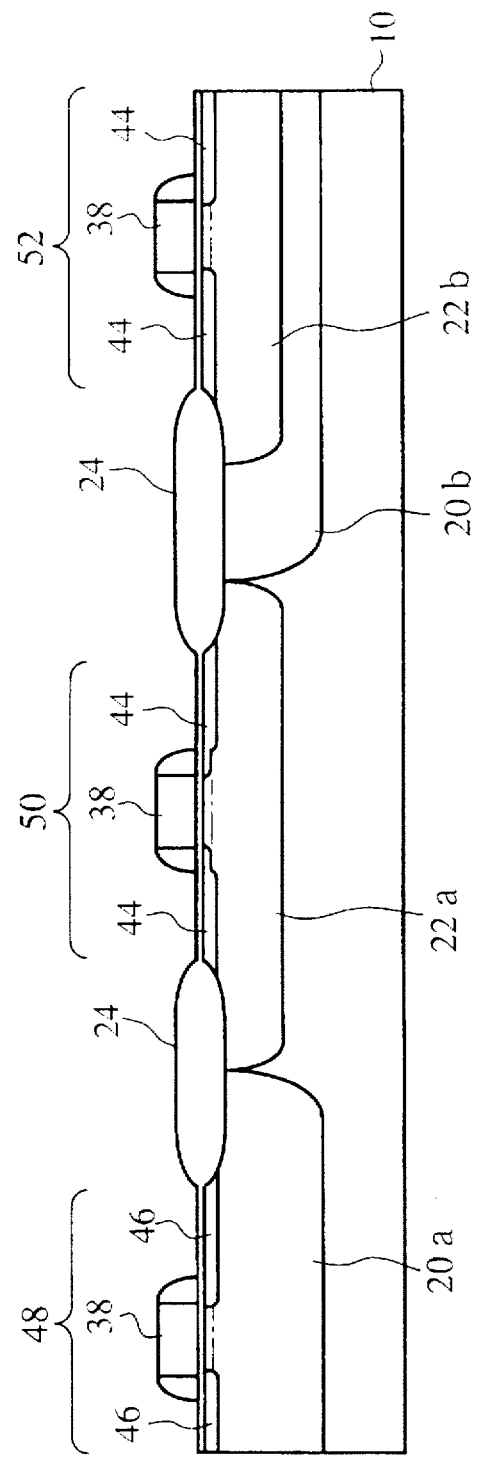
FIG. 19 is sectional views of the semiconductor device according to the third embodiment in a step of the method for fabricating the same explaining the method (Part 4).
Figure 20A:
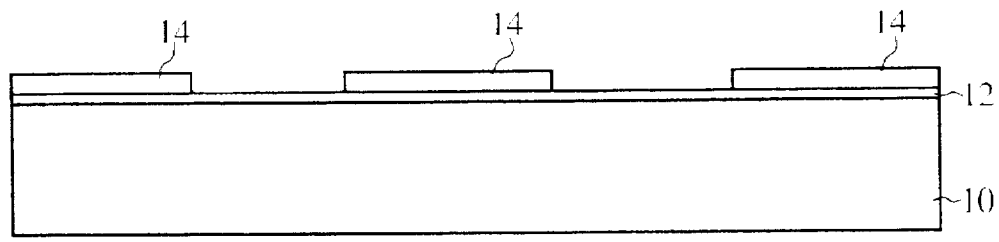
FIGS. 20A to 20D are sectional views of the conventional semiconductor device in the steps of the method for fabricating the same explaining the method.
Figure 20B:
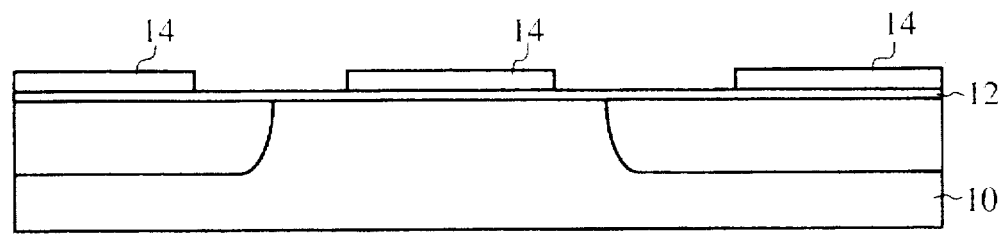
Figure 20C:
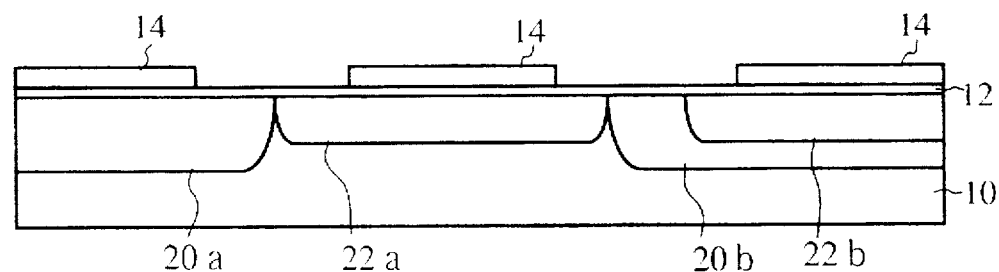
Figure 20D:
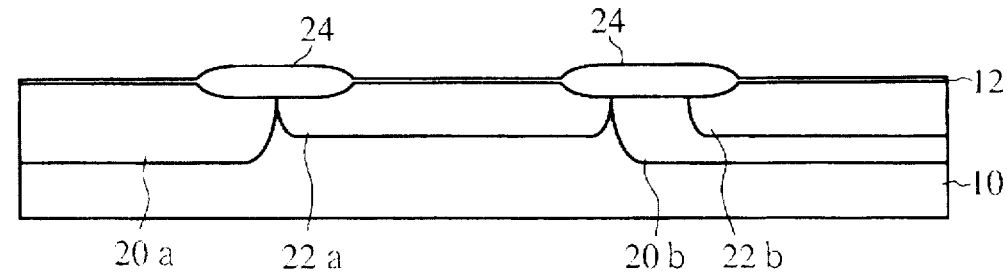
Figure 21A:
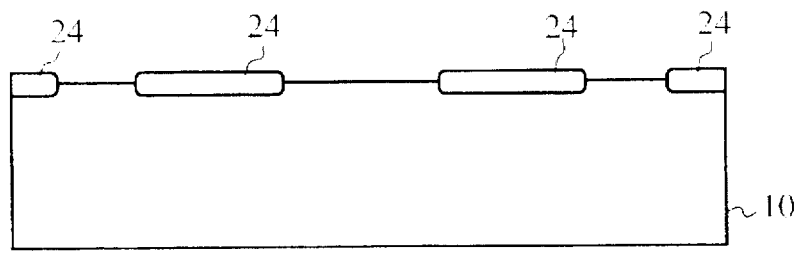
FIGS. 21A to 21D are sectional views of the conventional semiconductor device in the steps of the method for fabricating the same explaining the method.
Figure 21B:
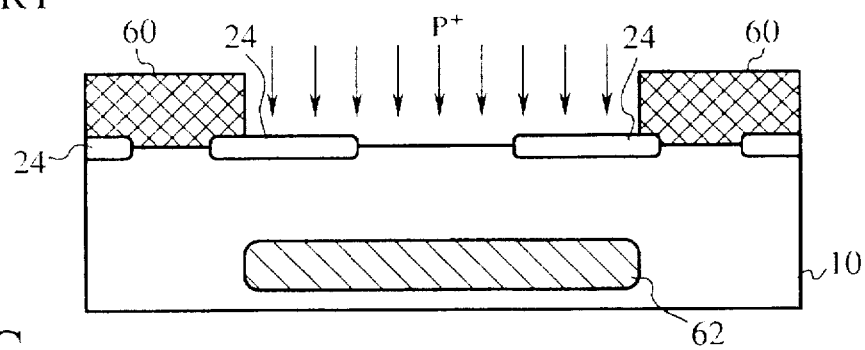
Figure 21C:
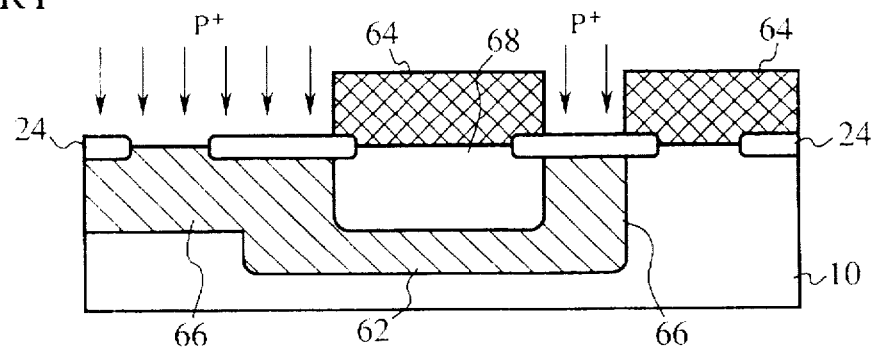
Figure 21D:
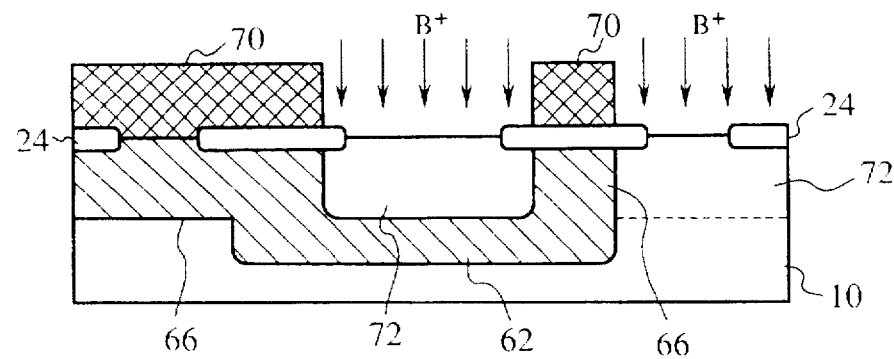

Subsequently, in the same way as, e.g., the first embodiment, the transistors are formed by the usual process for forming MOS transistors, and the three kinds wells of the p-type transistor 48 in the n-well 20a, the n-type transistor 50 in the p-well 22a, and the n-type transistor 52 in the p-well 22b in the n-well 20b are formed (FIG. 19).

Thus, according to the present embodiment, because the n-wells are formed by plural time-ion implanting operations including the high-energy ion implantation, no drive-in diffusion is necessary. As a result, very effectively to miniaturization of the device, lateral diffusion of the impurities can be minimized, and a narrow well interval can be achieved. In addition, by the high-energy ion implantation, the high-concentration impurity-doped layers can be formed deep in the wells, which results good resistance to avoiding latch-up.

Furthermore, the wells are formed after the device isolation films are formed, and no drive-in diffusion is conducted after the formation of the wells. Accordingly, the well concentration immediately below the device regions is sufficiently high, and formation of channel stoppers is not necessary.

The formation of the triple wells and the channel stoppers can be achieved by two lithographic operations. In comparison with the conventional method for fabricating a semiconductor device using high-energy ion implantation, the method according to the present embodiment can omit one lithographic step.

By means of the third embodiment, a method for fabricating the semiconductor device by which, in addition to the usual n-well and p-well, the p-well is formed in the n-well has been explained. However, the present invention is applicable to a method for fabricating the semiconductor device having a triple-well structure with an n-well being additionally formed in a p-well.

In the third embodiment, the n-wells are formed by two ion implanting operations, and the p-wells are formed by once-ion implanting operation. But the number of ion implanting operations is not limited to that of the embodiment. For example, it is possible that punch-through stoppers may be added for prevention of source-drain punch-through due to shorter channels of transistors. It is also possible that, in the case where punch-through may occur between the source/drain diffused layers and the n-well, ion implantation for formation of high-concentration impurity-doped layers as in the first embodiment is added. This addition can be achieved simply by adding ion implanting steps to the well-forming process.

The method for forming the n-wells is not limited to the third embodiment. For example, for the formation of the n-wells, the ion implantation can be conducted before the formation of the device isolation films, and drive-in diffusion can be conducted. In this case, lateral diffusion of the impurities is unavoidable. But the triple wells can be achieved by two lithographic operations, and punch-through between the source/drain diffused layers and the n-well can be prevented. Furthermore, this n-wells drive in method does not have the problem related to the high energy equipment cost because the energy to form p-well is not so high (180 keV is allowable) that conventional equipments can be used. And further, this method strongly decrease the damage problem caused by high energy n-well implantation.

What is claimed is:

1. A semiconductor device comprising:

a first conduction-type semiconductor substrate;

a first well of a second conduction-type formed in a first region in a primary surface of the semiconductor substrate;

a second well of a second conduction-type formed in a second region in the primary surface of the semiconductor substrate;

a third well of the first conduction-type formed in a third region in the primary surface of the semiconductor substrate;

a fourth well of the first conduction-type formed in the first well;

a high-concentration impurity-doped layer of the first conduction-type formed in a region of the fourth well deep in the semiconductor substrate spaced from a primary surface of the semiconductor substrate in a device region, an impurity concentration of the high-concentration impurity-doped layer of the first conductive-type being higher than that near the primary surface thereof;

a first MOS transistor of the first conduction-type formed in the second well;

a second MOS transistor of the second conduction-type formed in the third well; and a third MOS transistor of the second conduction-type formed in the fourth well, wherein the second conduction-type impurity distribution from the primary surface of the semiconductor substrate in the fourth well to the bottom of the first well, and the second conduction-type impurity distribution from the primary surface of the semiconductor substrate in the second well to the bottom of the second well, are substantially the same.

2. A semiconductor device according to claim 1, wherein the high-concentration impurity-doped layer of the first conduction type is formed immediately below a device isolation film defining the device region.

3. A semiconductor device comprising:

a first conduction-type semiconductor substrate;

a first well of a second conduction-type formed in a first region in a primary surface of the semiconductor substrate;

a second well of a second conduction-type formed in a second region in the primary surface of the semiconductor substrate;

a third well of the first conduction-type formed in a third region in the primary surface of the semiconductor substrate;

a fourth well of the first conduction-type formed in the first well;

a first MOS transistor of the first conduction-type formed in the second well;

a second MOS transistor of the second conduction-type formed in the third well; and a third MOS transistor of the second conduction-type formed in the fourth well, an impurity concentration of the fourth well deep in the semiconductor substrate spaced from the primary surface of the semiconductor substrate being higher than that at the primary surface thereof, wherein the second conduction-type impurity distribution from the primary surface of the semiconductor substrate in the fourth well to the bottom of the first well, and the second conduction-type impurity distribution from the primary surface of the semiconductor substrate in the second well to the bottom of the second well, are substantially the same.

4. A semiconductor device according to claim 3, wherein an impurity concentration of the first well and the second well deep in the semiconductor substrate spaced from the primary surface of the semiconductor substrate is higher than that at the primary surface thereof.

5. A semiconductor device comprising:

a first conduction-type semiconductor substrate;

a first well of a second conduction-type formed in a first region in a primary surface of the semiconductor substrate;

a second well of a second conduction-type formed in a second region in the primary surface of the semiconductor substrate;

a third well of the first conduction-type formed in the first well;

a high-concentration impurity-doped layer of the first conduction-type formed in a region of the third well deep in the semiconductor substrate spaced from the primary surface of the semiconductor substrate in a device region, an impurity concentration of the high-concentration impurity-doped layer of the first conduction-type being higher than that near the primary surface thereof;

a first MOS transistor of the first conduction-type formed in the second well;

a second MOS transistor of the second conduction-type formed in the third well;

the second conduction-type impurity distribution, from the primary surface of the semiconductor substrate in the third well to the bottom of the first well, and the second conduction-type impurity distribution, from the primary surface of the semiconductor substrate in the second well to the bottom of the second well, being substantially the same.

6. A semiconductor device comprising:

a first conduction-type semiconductor substrate;

a first well of a second conduction-type formed in a first region in a primary surface of the semiconductor substrate;

a second well of a second conduction-type formed in a second region in the primary surface of the semiconductor substrate;

a third well of the first conduction-type formed in a third region in the primary surface of the semiconductor substrate;

a fourth well of the first conduction-type formed in the first well;

a high-concentration impurity-doped layer of the first conduction-type formed in a region of the fourth well deep in the semiconductor substrate spaced from the primary surface of the semiconductor substrate in a device region, an impurity concentration of the high-concentration impurity-doped layer of the first conduction-type being higher than that near the primary surface thereof;

a first MOS transistor of the first conduction-type formed in the second well;

a second MOS transistor of the second conduction-type formed in the third well; and a third MOS transistor of the second conduction-type formed in the fourth well, the second conduction-type impurity distribution, from the primary surface of the semiconductor substrate in the fourth well to the bottom of the first well, and the second conduction-type impurity distribution, from the primary surface of the semiconductor substrate in the second well to the bottom of the second well, being substantially the same, and the high-concentration impurity-doped layer preventing punch-through from a source/drain diffused layer of the third MOS transistor to the first well.

* * * * *